United States Patent
Diaz et al.

(10) Patent No.: US 12,025,771 B2
(45) Date of Patent: Jul. 2, 2024

(54) DYNAMIC BEAM STEERING WITH METASURFACE

(71) Applicant: Meta Platforms Technologies, LLC, Menlo Park, CA (US)

(72) Inventors: Liliana Ruiz Diaz, Redmond, WA (US); Maik Andre Scheller, Redmond, WA (US); Hao Yang, Los Angeles, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 398 days.

(21) Appl. No.: 17/217,904

(22) Filed: Mar. 30, 2021

(65) Prior Publication Data
US 2022/0317438 A1  Oct. 6, 2022

(51) Int. Cl.
  *G02B 1/00* (2006.01)
  *G02B 26/08* (2006.01)
  *G02B 27/09* (2006.01)
  *H01S 5/00* (2006.01)

(52) U.S. Cl.
  CPC ......... *G02B 1/002* (2013.01); *G02B 26/0883* (2013.01); *G02B 27/0938* (2013.01); *H01S 5/0071* (2013.01)

(58) Field of Classification Search
  CPC ........... G02B 26/0883; G02B 1/002; G02B 27/0938; G02B 26/0808; G02B 27/0093; G02B 27/0172; G02B 27/0916; G02B 27/0944; H01S 5/0071
  See application file for complete search history.

(56) References Cited

U.S. PATENT DOCUMENTS

| 10,886,702 B2 | 1/2021 | Hatzilias |
| 2012/0170114 A1* | 7/2012 | Domash ............. G02B 1/002 359/359 |
| 2018/0364487 A1 | 12/2018 | Yeoh et al. |
| 2019/0243155 A1* | 8/2019 | You .................. G02B 1/002 |
| 2020/0025893 A1* | 1/2020 | Jang .................. G01S 7/4817 |
| 2020/0067278 A1* | 2/2020 | Han .................. H01S 5/18377 |
| 2020/0150408 A1 | 5/2020 | Fard |
| 2020/0153203 A1 | 5/2020 | Hatzilias |
| 2020/0259307 A1 | 8/2020 | Sharma et al. |
| 2021/0066893 A1* | 3/2021 | Jang ................. H01S 5/18377 |
| 2021/0263329 A1* | 8/2021 | Latawiec ............. G02B 27/48 |
| 2021/0307608 A1* | 10/2021 | Hu ................... G02B 1/002 |
| 2021/0352249 A1* | 11/2021 | Flock ................. H04N 9/317 |

FOREIGN PATENT DOCUMENTS

DE  102018126065 A1  4/2020

OTHER PUBLICATIONS

U.S. Appl. No. 16/918,674, Robin Sharma.
U.S. Appl. No. 17/207,142, Maik Andre Scheller.
International Search Report and Written Opinion for International Application No. PCT/US2022/022276, dated Jul. 20, 2022, 11 pages.

* cited by examiner

*Primary Examiner* — Darryl J Collins
*Assistant Examiner* — Matthew Y Lee
(74) *Attorney, Agent, or Firm* — Freestone Intellectual Property Law PLLC; Aaron J. Visbeek

(57) ABSTRACT

Beam steering devices include a laser and a metasurface for dynamic beam shaping of laser light. A steering actuator may adjust a metasurface with respect to a laser to dynamically shape the beam. Lasers in a plurality of lasers may be selectively activated to generate a desired beam shape.

19 Claims, 21 Drawing Sheets

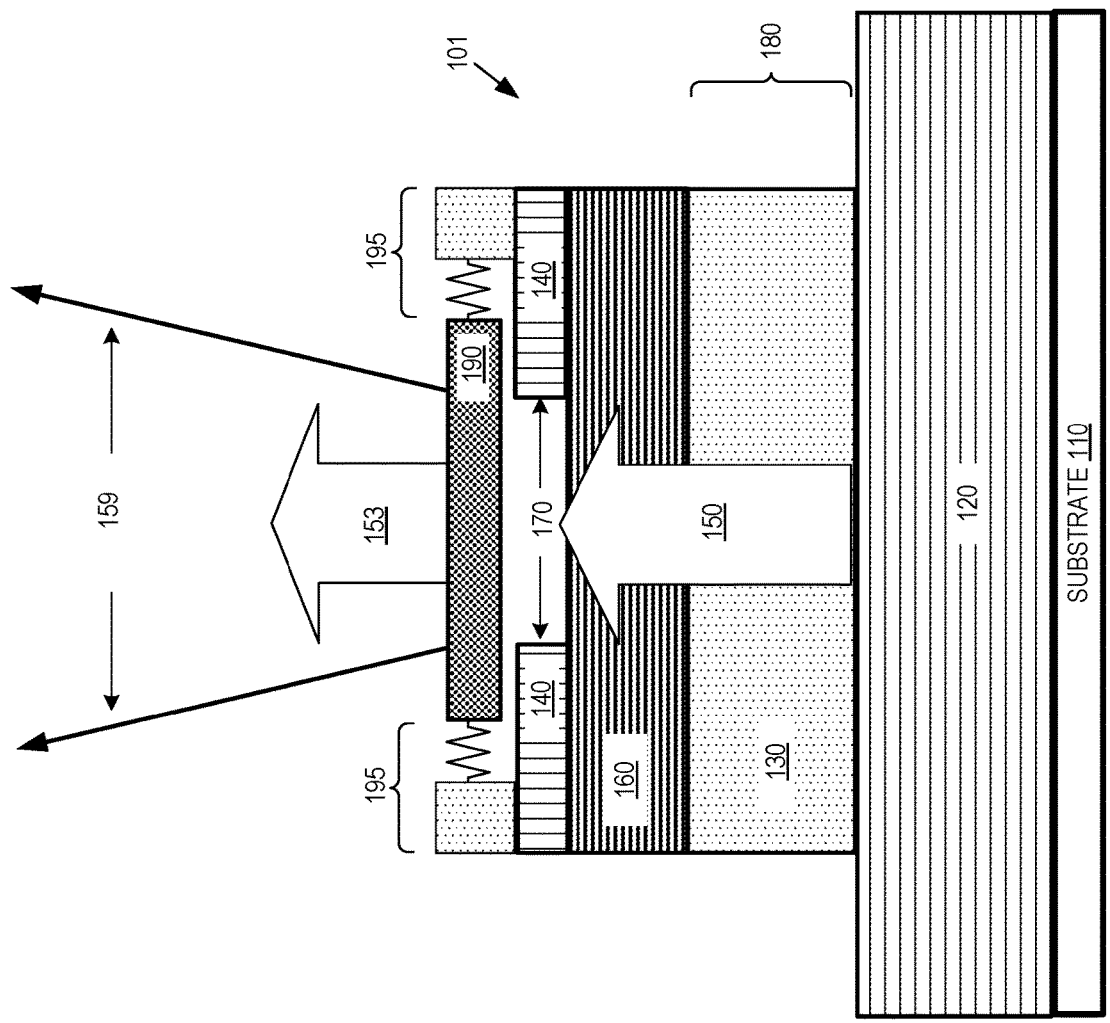

DYNAMIC BEAM STEERING WITH METASURFACE

TECHNICAL FIELD

This disclosure relates generally to optics, and in particular to dynamic beam steering with a metasurface.

BACKGROUND INFORMATION

Refractive lenses are commonly used to focus light emitting from a light source. For example, refractive lenses may have convex or concave surfaces to focus, defocus, or collimate a beam of light emitted from the light source. However, refractive lenses may have significant thickness, footprint, and/or weight with respect to the light sources, especially to achieve certain beam shaping functionality. Furthermore, conventional refractive lens configurations only provide static beam shapes to the emitted light.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 1A illustrates a light source including a laser, a metasurface, and a steering actuator configured to adjust a position of the metasurface with respect to the laser, in accordance with aspects of the disclosure.

DETAILED DESCRIPTION

Figure 1B:
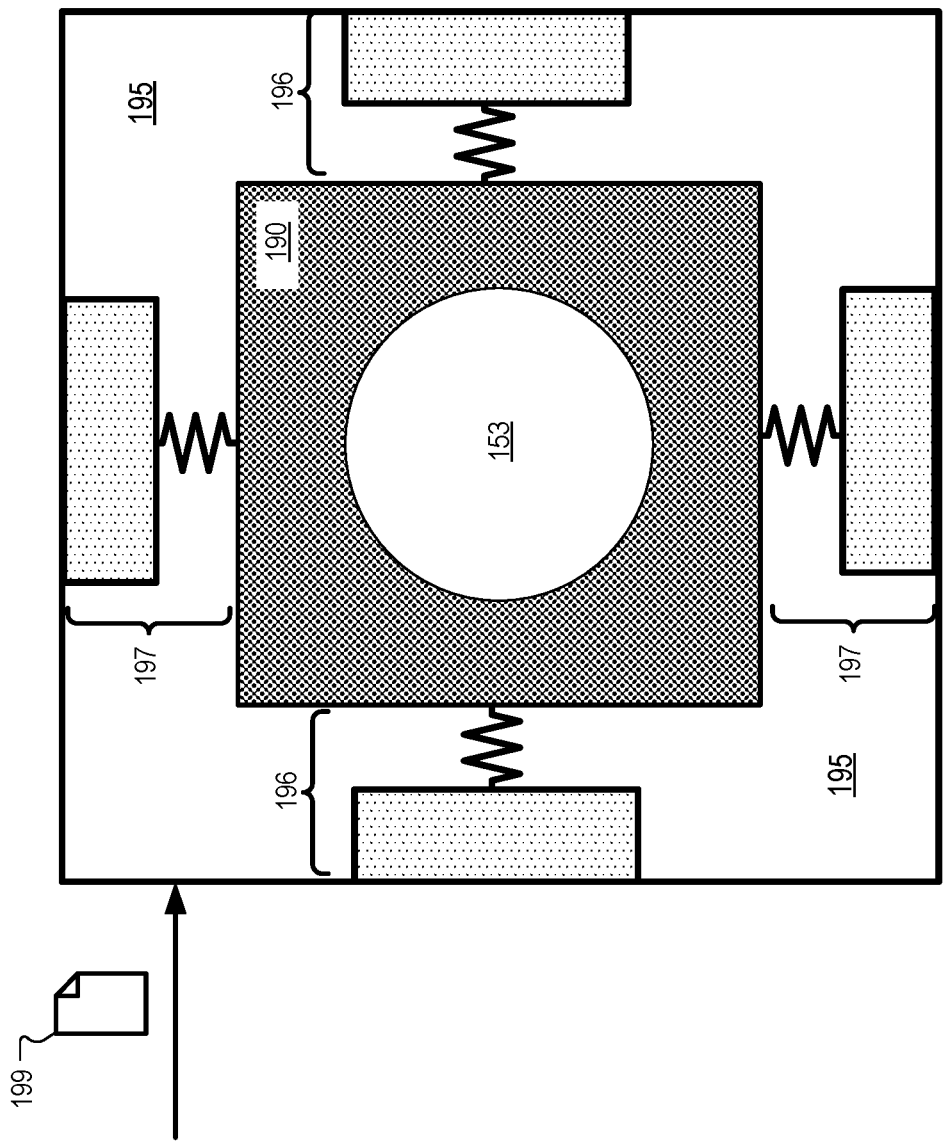
FIG. 1B illustrates a top view of an example steering actuator, in accordance with aspects of the disclosure.

Embodiments of dynamic beam steering with a metasurface are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In some implementations of the disclosure, the term "near-eye" may be defined as including an element that is configured to be placed within 50 mm of an eye of a user while a near-eye device is being utilized. Therefore, a "near-eye optical element" or a "near-eye system" would include one or more elements configured to be placed within 50 mm of the eye of the user.

In aspects of this disclosure, visible light may be defined as having a wavelength range of approximately 380 nm-700 nm. Non-visible light may be defined as light having wavelengths that are outside the visible light range, such as ultraviolet light and infrared light. Infrared light having a wavelength range of approximately 700 nm-1 mm includes near-infrared light. In aspects of this disclosure, near-infrared light may be defined as having a wavelength range of approximately 700 nm-1.4 µm.

In aspects of this disclosure, the term "transparent" may be defined as having greater than 90% transmission of light. In some aspects, the term "transparent" may be defined as a material having greater than 90% transmission of visible light.

Embodiments of the disclosure include a metasurface configured to generate dynamically shaped laser light from a laser such as a vertical-cavity surface-emitting laser (VCSEL). A steering actuator (e.g. piezo actuator, a micro-electro-mechanical system (MEMS), and/or an electrostatic actuator) is configured to adjust a position of the metasurface with respect to the laser to change a beam shape of the laser. For example, the steering actuator may be configured to change an axial position of the metasurface with respect to an optical axis of the laser. By adjusting the axial position of the metasurface with respect to the laser, the laser light is dynamically shaped. The metasurface may be formed of a refractive semiconductor layer or a refractive dielectric material, for example.

In an embodiment, a plurality of metasurfaces are disposed over a plurality of lasers. The metasurfaces are configured to have a different illumination profiles. Processing logic activates a laser in the plurality of lasers to emit laser light in response to a steering signal. Therefore, by selectively activating different lasers in the plurality of lasers, different beam shapes can be selected since the metasurfaces have different beam shaping profiles.

In an example context, the dynamic beam shaping using metasurfaces are implemented in a near-eye optical element of a head mounted device. One or more near-infrared VCSELs may illuminate an eyebox area to facilitate imaging of the eyebox (for eye-tracking purposes, for example). The near-infrared beam from the VCSEL or VCSELs may change based on a position of the eye. Selectively illuminating the eyebox area with different beam shapes may increase imaging accuracy and/or save electrical power. The implementations of this disclosure may also reduce weight, footprint, and/or reduce system complexity when the number of light sources can be reduced because fewer light sources are able to achieve the illumination functionality of multiple light sources. These and other embodiments are described in more detail in connection with FIGS. 1A-10B.

FIG. 1A illustrates a light source 100 including a laser 101, a metasurface 190, and a steering actuator 195 configured to adjust a position of metasurface 190 with respect to the laser 101, in accordance with aspects of the disclosure. Laser 101 in FIG. 1A is a vertical-cavity surface-emitting laser (VCSEL) that includes a semiconductor substrate 110, a first reflector layer 120, an active region 130, an aperture definition layer 140 defining aperture 170, and a second reflector layer 160. First reflector layer 120 may be configured as an N doped Distributed Bragg Reflector (DBR) and second reflector layer 160 may be configured as a P doped DBR, in some implementations. Aperture definition layer 140 may be a metal layer, in some implementations. Beam shaping metasurface 190 may have a thickness 193 of less than 500 nm, in some aspects. Beam shaping metasurface 190 may be formed in a refractive layer. The refractive layer may include a refractive semiconductor layer, a refractive insulator, and/or a refractive dielectric layer. The refractive layer may have a high refractive index. In some aspects, the refractive layer has a refractive index greater than three. In a particular example, metasurface 190 includes a gallium arsenide (GaAs) layer. Metasurface 190 may include an aluminum-gallium-arsenide (AlGaAs) layer. Metasurface 190 may include a transparent dielectric material such as silicon-dioxide ($SiO_2$), aluminum-oxide ($Al_2O_3$), silicon-nitride (SiN), titanium-dioxide ($TiO_2$) and/or other suitable transparent dielectric material.

In operation, laser light 150 is generated in laser cavity 180 when the VCSEL 101 receives electrical current. While not specifically illustrated, a first electrical contact connected to first reflector layer 120 and a second electrical contact connected to second reflector layer 160 allow for a voltage potential across first reflector layer 120 and second reflector layer 160 when VCSEL 101 is powered on. Laser cavity 180 is disposed between first reflector layer 120 and second reflector layer 160. First reflector layer 120 may be approximately 99.9% reflective and second reflector layer 160 may be approximately 99.0% reflective, for example. While laser light reflects between first reflector layer 120 and second reflector layer 160 in laser cavity 180, a portion of the laser light 150 propagates through second reflector layer 160 and through aperture 170 and becomes incident on beam shaping metasurface 190.

Beam shaping metasurface 190 receives laser light 150 and generates dynamically shaped laser light 153 in response to receiving laser light 150 from laser cavity 180. In the illustration of FIG. 1A, beam shaping metasurface 190 is configured to defocus the laser light 150 so that dynamically shaped laser light 153 has a diverging beam shape 159. Steering actuator 195 may position metasurface 190 to change a beam shape of the dynamically shaped laser light 153 so that dynamically shaped laser light 153 has a different beam shape than diverging beam shape 159. For example, changing the position of metasurface 190 may increase or decrease a deflection angle of dynamically shaped laser light 153 and/or change a divergence/convergence of dynamically shaped laser light 153. Beam shaping metasurfaces in this disclosure may be configured to generate converging beam shapes, collimated beam shapes, and/or deflected beam shapes. Beam shaping metasurface 190 may be configured to generate converging beam shapes, collimated beam shapes, and/or deflected beam shapes depending on the position of metasurface 190 with respect to laser 101. Multiple different beam shaping profiles may be "written" into the same metasurface 190 so that adjusting the metasurface generates a different beam shape corresponding to the different beam shaping profile.

The line width of VCSEL 101 may be very narrow (e.g. 2-4 nm). VCSEL 101 may emit collimated laser light 150 prior to laser light 150 being shaped by metasurface 190 into dynamically shaped laser light 153. VCSEL 101 may be a visible light VCSEL emitting laser light 150 having a wavelength centered around a wavelength in the visible spectrum (e.g. 550 nm for green light). VCSEL 101 may be a near-infrared VCSEL emitting laser light 150 having a wavelength centered around 850 nm. VCSEL 101 may be a near-infrared VCSEL emitting laser light 150 having a wavelength centered around 940 nm. VCSEL 101 may be an ultraviolet VCSEL emitting laser light 150 having a wavelength centered around 350 nm.

FIG. 1B illustrates a top view of an example steering actuator 195 where dynamically shaped laser light 153 is propagating out of the page. The illustrated steering actuator 195 is a two-axis steering actuator 195. First-axis actuators 196 are configured to adjust metasurface 190 along a first axis (e.g. x-axis) and second-axis actuators 197 are configured to adjust metasurface 190 along a second axis (e.g. y-axis). Steering actuator 195 may be a single axis steering actuator, in some implementations. Steering actuator 195 may be a micro-electro-mechanical system (MEMS). Steering actuator 195 may utilize piezo or electrostatic technologies. In one implementations, steering actuator 195 includes electrostatic comb drives to adjust metasurface 190 along the first axis and along the second axis. Fast switching micro-mirror technologies deployed in commercialized spatial light modulators (SLMs) may be used to manipulate/adjust metasurface 190.

Steering actuator 195 may be coupled to laser 101. Steering actuator 195 may be formed in a same semiconductor fabrication process that forms laser 101. Steering actuator 195 adjusts a position of metasurface 190 in response to steering signal 199. Steering signal 199 may be an analog signal or a digital signal. Steering actuator 195 may include on-board processing logic to drive actuators 196 and/or 197 in response to steering signal 199.

Figure 2A:
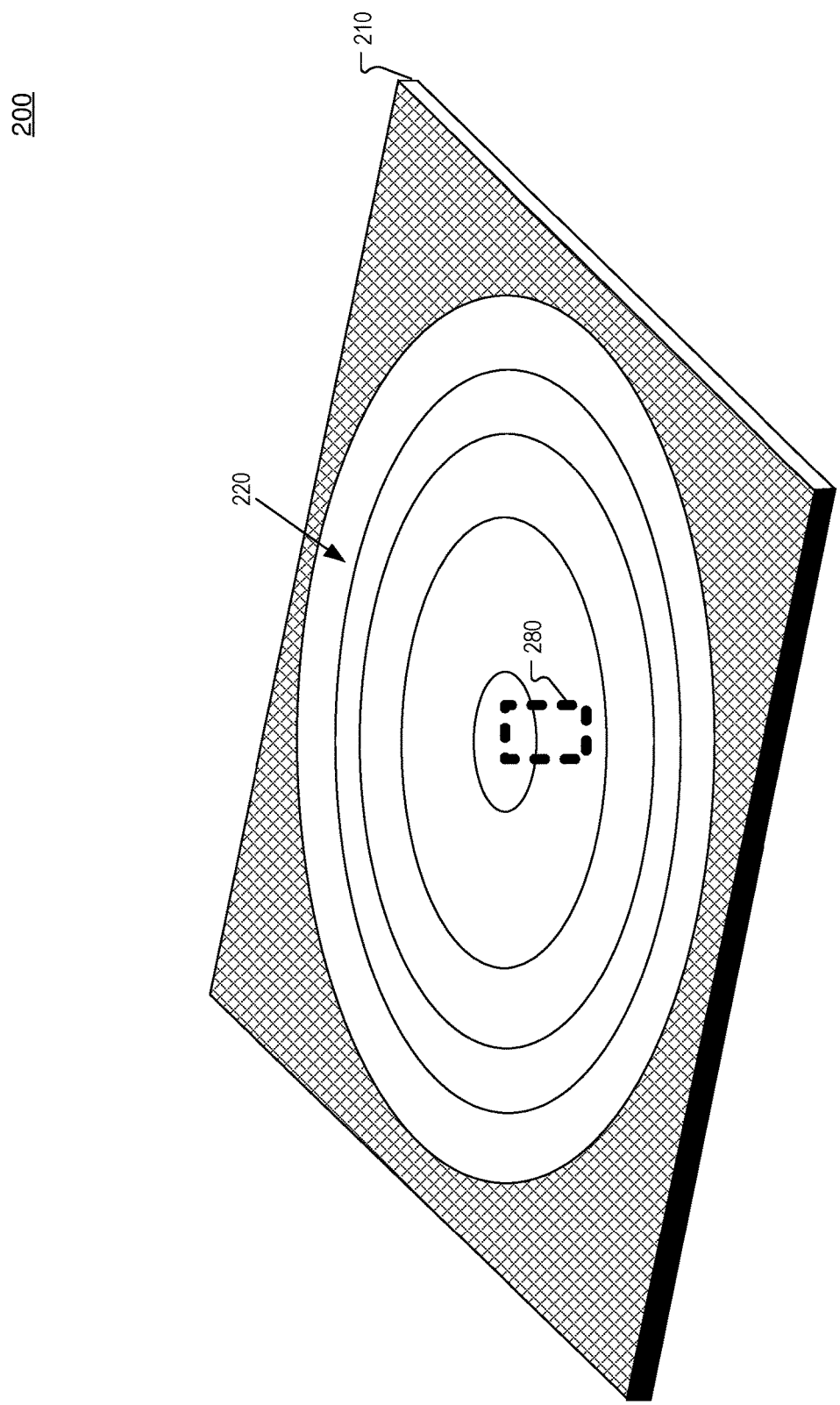
FIGS. 2A-2D illustrate an example implementation of a hybrid beam shaping metasurface, in accordance with aspects of the disclosure.

FIGS. 2A-2D illustrate an example implementation of a hybrid beam shaping metasurface, in accordance with aspects of the disclosure. FIG. 2A illustrates an example hybrid beam shaping metasurface 200 that includes a first refractive semiconductor layer 210 and a second refractive semiconductor layer 220. In some implementations, layer 210 and 220 may include transparent dielectric materials or other transparent insulators instead of semiconductor materials. Metasurface 200 may be used as an example of metasurface 190, in FIG. 1. Metasurface 200 may be polarization insensitive such that it can shape laser light 150 into dynamically shaped laser light 153 regardless of the polarization orientation of incident laser light 150.

Figure 2C:
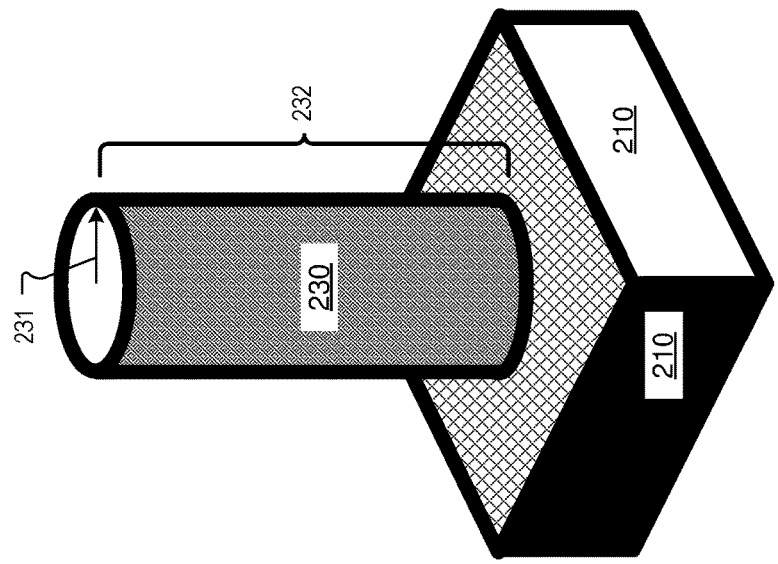
Figure 2B:
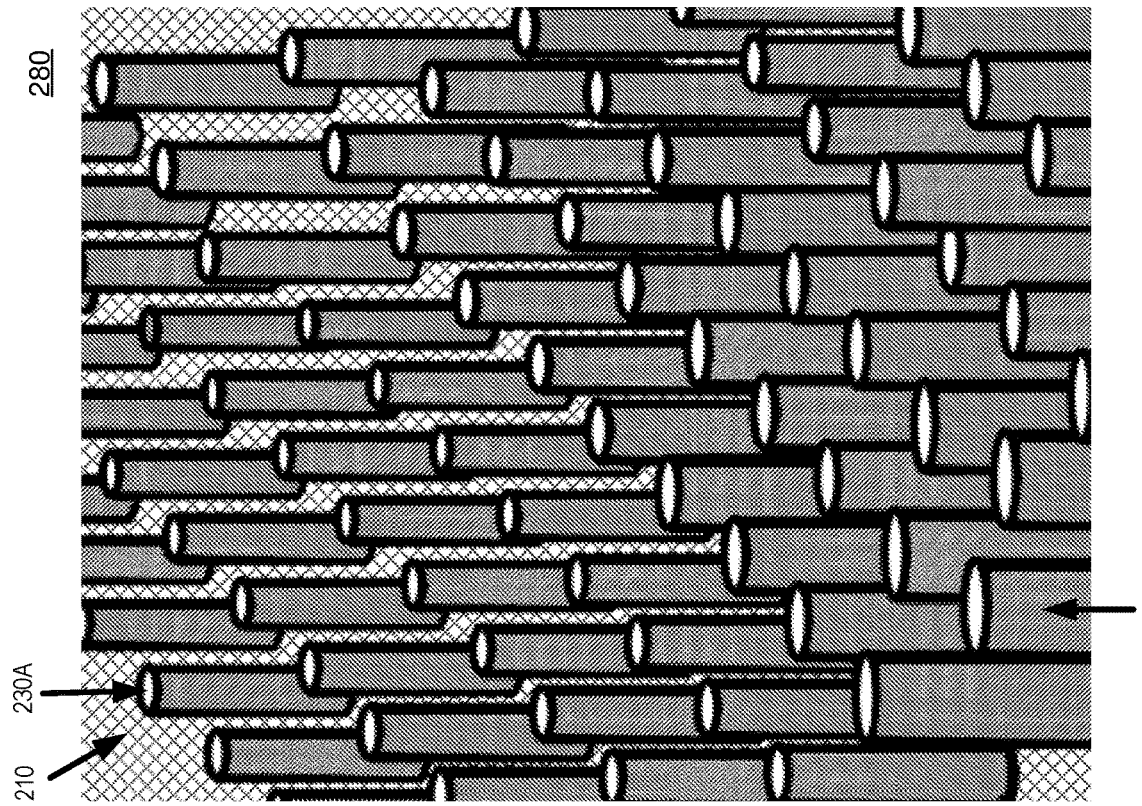

FIG. 2B illustrates a zoomed-in view of section 280 of metasurface 200 of FIG. 2A. FIG. 2B illustrates that a plurality of nanostructures 230 are formed in the second refractive semiconductor layer 220 and are disposed on the first refractive semiconductor layer 210. In the particular illustration, nanostructures 230 are shaped as nanopillars that may have different radii and are arranged in two-dimensions. FIG. 2C illustrates that a nanostructure 230 that is a nanopillar having a radius 231 and a height 232 where the nanostructure is disposed over first refractive semiconductor layer 210. In other implementations, a nanostructure 230 that is different than a nanopillar may be used as the meta-unit in metasurface 200. FIG. 2B illustrates that the nanopillar that is nanostructure 230A may have a smaller radius than the nanopillar that is nanostructure 230X. Metasurface 200 may include a plurality of nanopillars having a first radius and second nanopillars having a second radius that is different from the first radius. The radius of nanopillars may progressively increase or decrease, in some implementations.

Metasurface 200 has meta-units or nanostructures that have sub-wavelength dimensions. In contrast, diffractive optical structures (e.g. Bragg gratings or holograms) have diffractive structures that are sized at or above the wavelength of the light the diffractive structure is tuned to act on. By way of example, if VCSEL 101 emits laser light centered around 850 nm, nanostructures 230 in metasurface 200 are dimensioned such that the longest dimension is less than 850 nm.

Figure 2D:
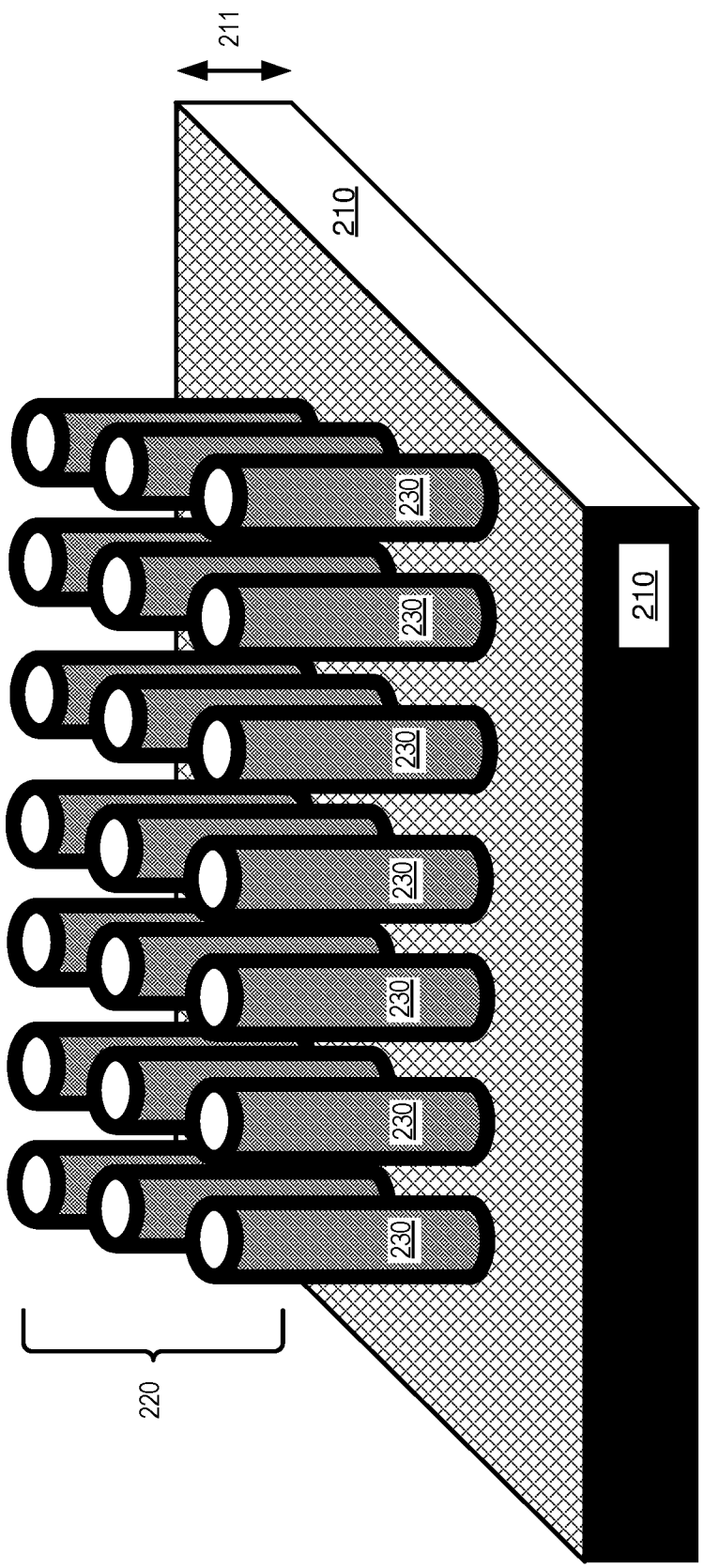

FIG. 2D illustrates that first refractive semiconductor layer 210 may have a constant thickness 211, while second refractive semiconductor layer 220 has varied thickness due to nanostructures 230 providing varying depth to second refractive semiconductor layer 220 to alter the phase of incident laser light 150 to provide the intended beam shaping profile. First refractive semiconductor layer 210 may have a first refractive index that is lower than a second refractive index of second refractive semiconductor layer 220 to increase the index contrast. The first refractive index and the second refractive index may be higher than three for near-infrared wavelengths.

In an implementation, first refractive semiconductor layer 210 includes indium-gallium-phosphate ($Ga_{0.5}In_{0.5}P$). Second refractive semiconductor layer 220 may include gallium-arsenide (GaAs). Second refractive semiconductor layer 220 may include aluminum-gallium-arsenide (AlGaAs).

Figure 3A:
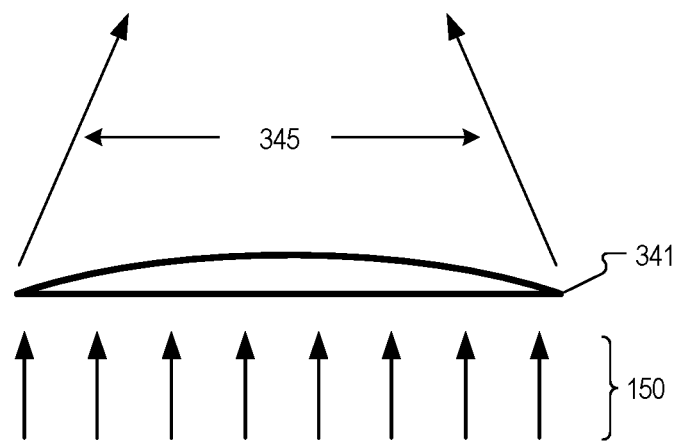
FIGS. 3A-3B illustrate an example beam shaping profile that controls a beam divergence of incident laser light, in accordance with aspects of the disclosure.
Figure 3B:
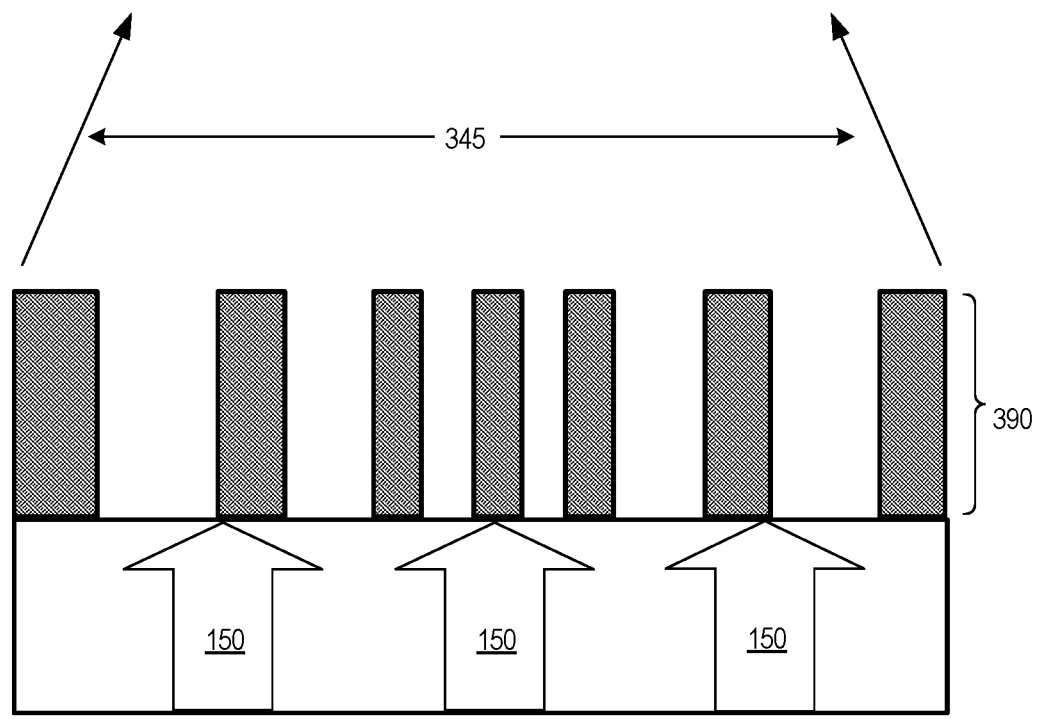

FIGS. 3A-3B illustrate an example beam shaping profile 341 that controls a beam divergence of incident laser light 150, in accordance with aspects of the disclosure. Beam shaping profile 341 controls a beam divergence of incident laser light 150 by focusing laser light 150 into shaped laser light 345. Shaped laser light 345 is converging. Beam shaping profile 341 may be considered a meta-lens. FIG. 3B illustrates beam shaping metasurface 390 can be configured similarly to beam shaping profile 341 to control the beam divergence of incident laser light 150 to generate shaped laser light 345. Beam shaping metasurface 390 may be configured to have different focal lengths. Beam shaping metasurface 390 may also be configured to collimate laser light 150 to generate collimated shaped laser light 345.

Figure 4A:
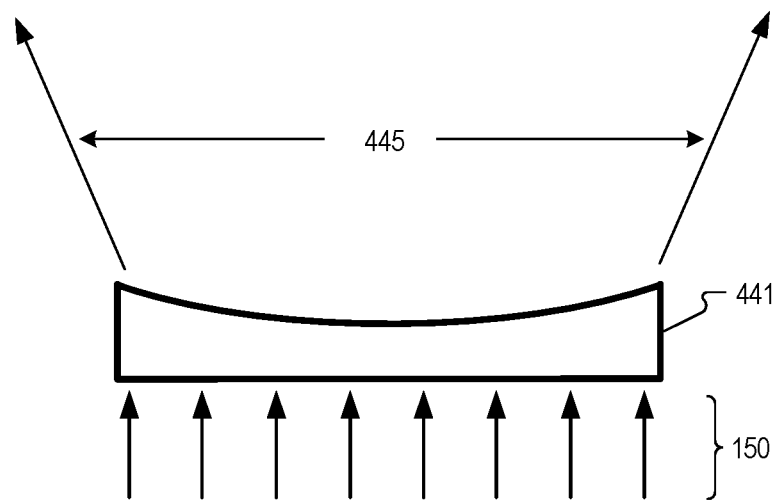
FIGS. 4A-4B illustrate an example beam shaping profile that controls a beam divergence of incident laser light, in accordance with aspects of the disclosure.
Figure 4B:
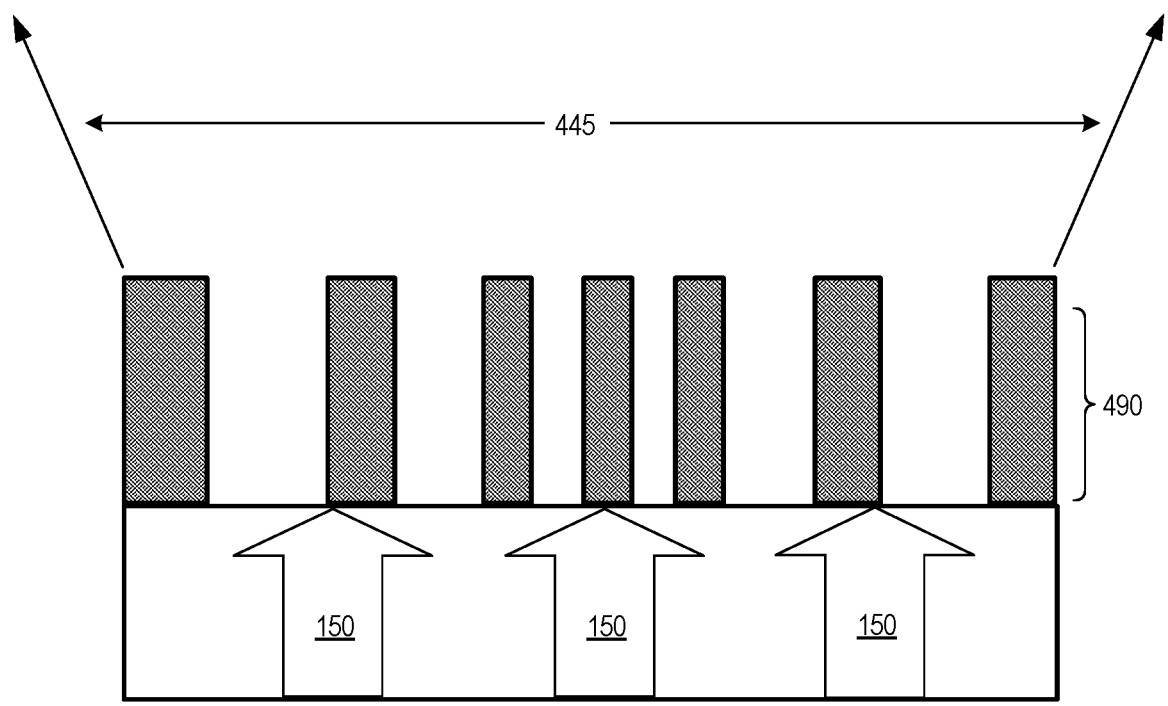

FIGS. 4A-4B illustrate an example beam shaping profile 441 that controls a beam divergence of incident laser light 150, in accordance with aspects of the disclosure. Beam shaping profile 441 controls a beam divergence of incident laser light 150 by defocusing laser light 150 into shaped laser light 445. Shaped laser light 445 is diverging. Beam shaping profile 441 may be considered a meta-lens. FIG. 4B illustrates beam shaping metasurface 490 can be configured similarly to beam shaping profile 441 to control the beam divergence of incident laser light 150 to generate shaped laser light 445. In some implementations, the beam divergence angle of a diverging shaped laser light 445 may have a divergence angle between 20 degrees and 60 degrees.

Figure 5A:
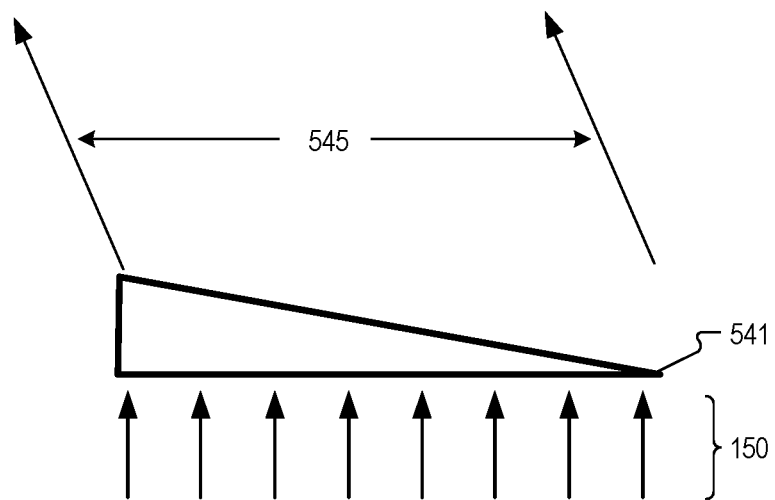
FIGS. 5A-5B illustrate an example beam shaping profile that controls a deflection angle of incident laser light, in accordance with aspects of the disclosure.
Figure 5B:
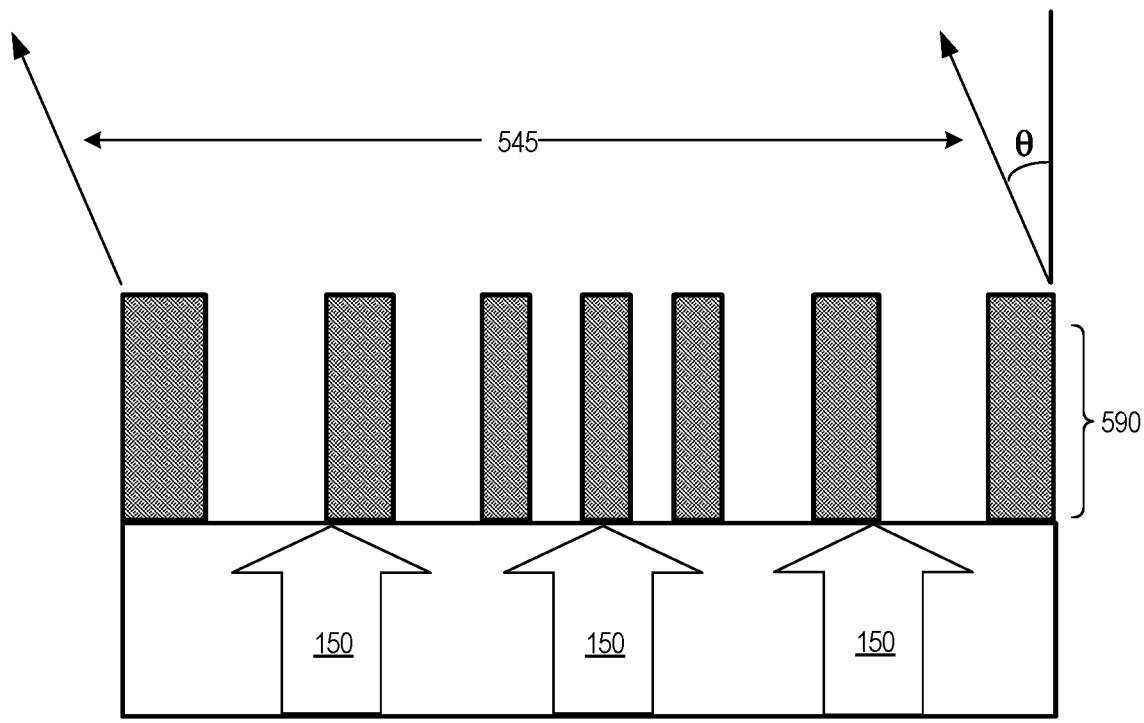

FIGS. 5A-5B illustrate an example beam shaping profile 541 that controls a deflection angle of incident laser light 150, in accordance with aspects of the disclosure. Beam shaping profile 541 controls a deflection angle of incident laser light 150 by deflecting laser light 150 into shaped laser light 545. Beam shaping profile 541 may be considered a meta-prism. FIG. 5B illustrates beam shaping metasurface 590 can be configured similarly to beam shaping profile 541 to control the deflection angle θ of incident laser light 150 to generate shaped laser light 545. Beam shaping metasurface 590 may be configured to deflect incident laser light 150 at different angles θ where θ is measured as the angle between incident laser light 150 and deflected shaped laser light 545.

The deflection angle θ can be designed according to a meta-prism phase profile according to the following relationship:

$$\phi(x,y)=2\pi/\lambda \cdot x \cdot \sin\theta \qquad \text{Equation (1)}$$

where φ represents the phase on the meta-prism surface, θ represents an angle between the incident light and deflected light, λ is the wavelength of laser light, and (x,y) are the spatial coordinates with respect to the center of the meta-prism. The phase change rate on the meta-prism adheres to the following relationship:

$$d\phi/dx=2\pi/\lambda \cdot \sin\theta \qquad \text{Equation (2)}$$

Figure 6A:
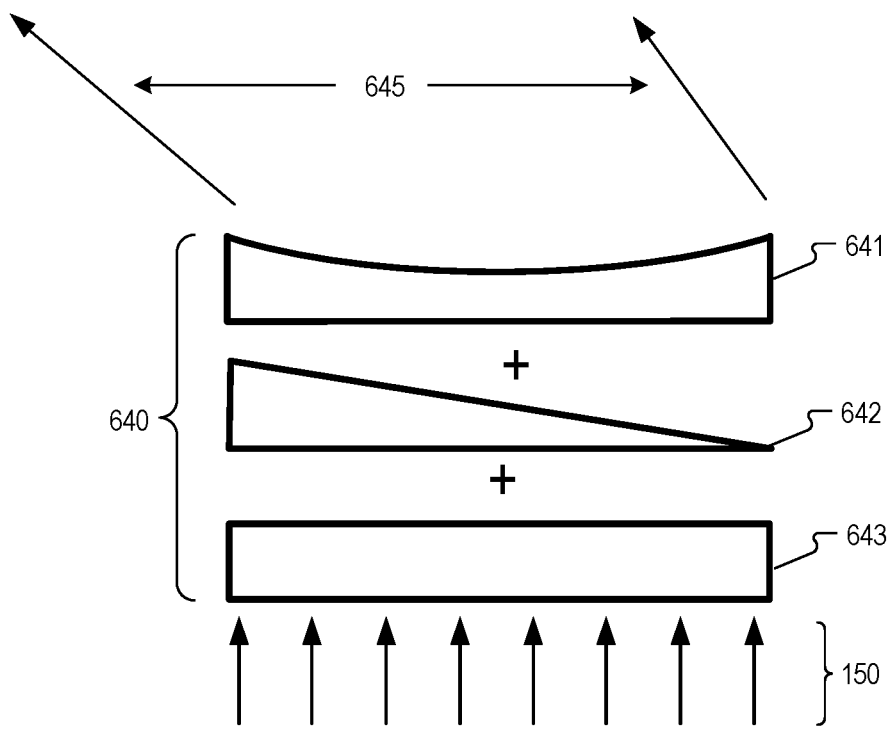
FIG. 6A illustrates an example beam shaping profile that includes a meta-lens component to control a beam divergence of laser light and meta-prism components that controls a deflection angle of laser light, in accordance with aspects of the disclosure.

FIG. 6A illustrates an example beam shaping profile 640 that includes a meta-lens component to control a beam divergence of laser light 150 and meta-prism components that controls a deflection angle of laser light 150, in accordance with aspects of the disclosure. Beam shaping profile 640 includes a meta-lens component 641 that defocuses laser light 150. Beam shaping profile 640 also includes meta-prism component 642 and a meta-prism component 643 to control a deflection angle of incident laser light 150 by deflecting laser light 150. Meta-prism component 643 is illustrated as a prism having a slope running into the page. Together, meta-prism component 642 and meta-prism component 643 control the deflection angle of shaped laser light 645 in two dimensions. Beam shaping metasurfaces (e.g. metasurface 190) of this disclosure can be configured similarly to beam shaping profile 640 to control the beam divergence and deflection angle of incident laser light 150 to generate shaped laser light 645.

Figure 6B:
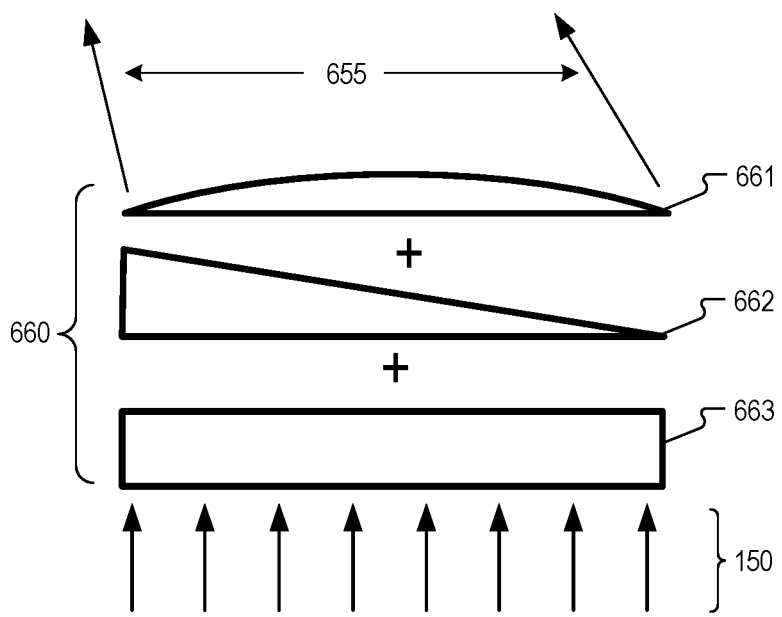
FIG. 6B illustrates an example beam shaping profile that includes a meta-lens component to control a beam divergence of laser light and meta-prism components that controls a deflection angle of laser light, in accordance with aspects of the disclosure.

FIG. 6B illustrates an example beam shaping profile 660 that includes a meta-lens component to control a beam divergence, convergence, or collimation of laser light 150 and meta-prism components that controls a deflection angle of laser light 150, in accordance with aspects of the disclosure. Beam shaping profile 660 includes a meta-lens component 661 that focuses laser light 150. Beam shaping profile 660 also includes meta-prism component 662 and a meta-prism component 663 to control a deflection angle of incident laser light 150 by deflecting laser light 150. Meta-prism component 663 is illustrated as a prism having a slope running into the page. Together, meta-prism component 662 and meta-prism component 663 control the deflection angle of shaped laser light 655 in two dimensions. Beam shaping metasurfaces (e.g. metasurface 190) of this disclosure can be configured similarly to beam shaping profile 660 to control the beam divergence and deflection angle of incident laser light 150 to generate shaped laser light 655.

FIGS. 6A and 6B illustrate that virtually any beam shaping profile can be written into metasurfaces of this disclosure. Furthermore, a plurality of different beam shaping profiles may be written into metasurfaces of this disclosure so that metasurface 190 may be moved with respect to laser 101 to illuminate the different beam shaping profiles and thus generate different beam shapes of dynamically shaped laser light 153. Consequently, metasurfaces of the disclosure can be configured to perform any combination of focusing, defocusing, and/or deflecting laser light 150 to generate shaped laser light.

Figure 7A:
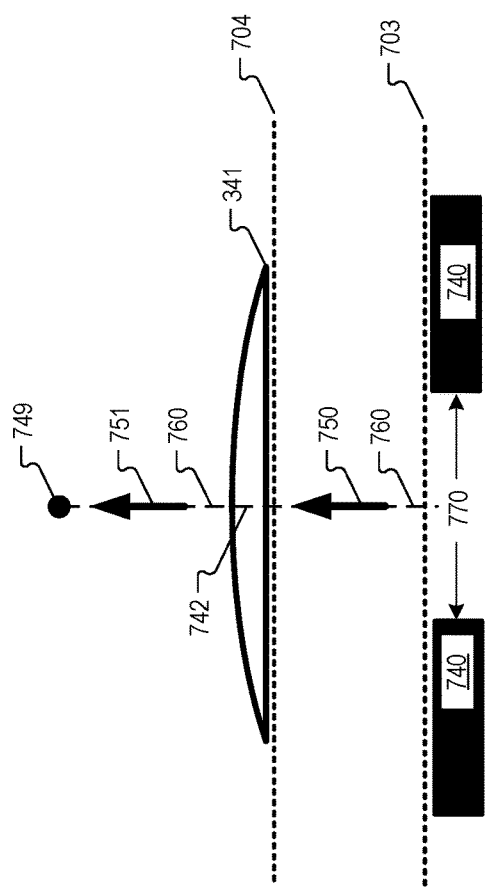
FIGS. 7A-7H illustrate a beam shaping profile of an equivalent metasurface in various alignment positions with respect to an optical axis of an optical aperture of a laser, in accordance with aspects of the disclosure.

FIG. 7A illustrates example beam shaping profile 341 of a metasurface being axially aligned with an optical axis 760 of an optical aperture 770 of a laser, in accordance with aspects of the disclosure. Of course, other beam shaping profiles may be used instead of beam shaping profile 341. Aperture definition layer 740 defines optical aperture 770 of a laser and optical axis 760 is orthogonal to a plane 703 that is parallel to optical aperture 770. Optical axis 760 runs through the center of optical aperture 770. Laser light 750 is focused to focal point 749 of beam shaping profile 341. Therefore, dynamically shaped laser light 751 propagates to focal point 749. In FIG. 7A, a steering actuator (e.g. steering actuator 195) positions the metasurface that includes beam shaping profile 341 in the illustrated position. A plane 704 of the metasurface having beam shaping profile 341 is illustrated as parallel to the plane 703 of the optical aperture 770 in FIG. 7A. The steering actuator may adjust the metasurface having beam profile 341 to different positions in plane 704.

Figure 7B:
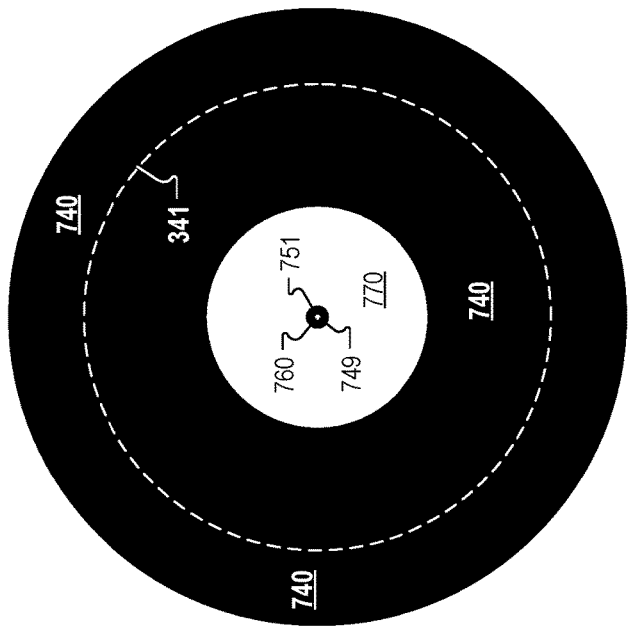

FIG. 7B illustrates a top view of the beam shaping profile 341 of the metasurface being axially aligned with the optical axis 760 of the optical aperture 770 of the laser. Thus, FIG. 7B illustrates dynamically shaped laser light 751 propagating along optical axis 760 and propagating along the central axis 742 of beam shaping profile 341 since optical axis 760 and central axis 742 are aligned in FIG. 7B. Dynamically shaped laser light 751 is running out of the page, in FIG. 7B. In the illustration of FIG. 7B, beam shaping profile 341 of the metasurface is concentric with optical aperture 770.

Figure 7C:
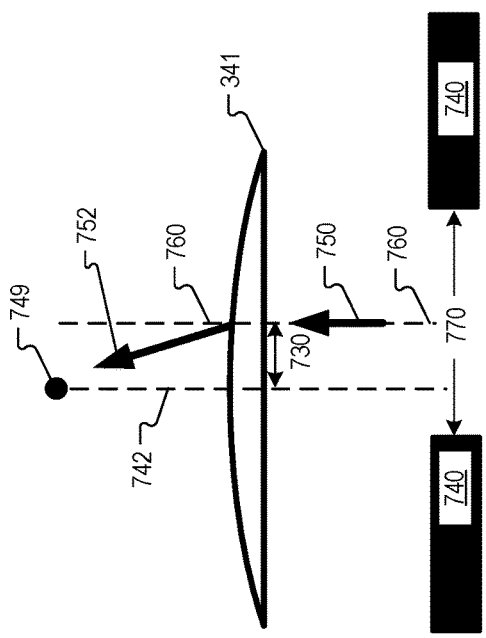
Figure 7D:
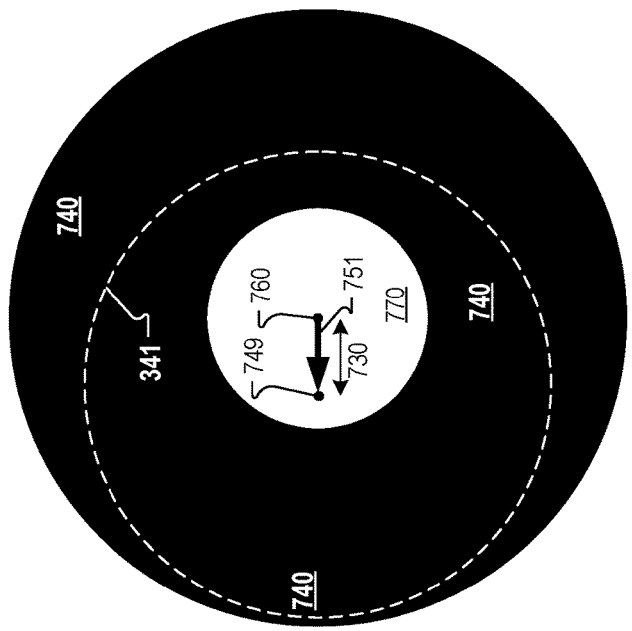

FIG. 7C illustrates central axis 742 of beam shaping profile 341 of a metasurface being offset from optical axis 760 of optical aperture 770, in accordance with aspects of the disclosure. A steering actuator adjusts an axial position of the metasurface with respect to the optical aperture 770 of the laser to change the beam shape of the dynamically shaped laser light 752. In contrast to dynamically shaped laser light 751 of FIG. 7A, dynamically shaped laser light 752 has a deflection angle resulting from a steering actuator adjusting a position of the metasurface by an offset distance 730. Offset distance 730 may be between one and five microns, for example. FIG. 7D illustrates a top view of beam shaping profile 341 being adjusted by offset distance 730 and illustrates dynamically shaped laser light 752 having a deflection angle to reach focal point 749. In particular, the central axis 742 of beam shaping profile 341 has been adjusted by offset distance 730 along an x-axis to move focal point 749 by offset distance 730.

Figure 7E:
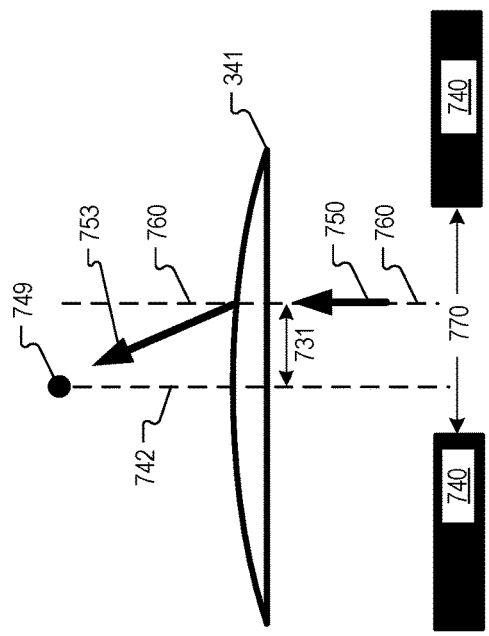
Figure 7F:
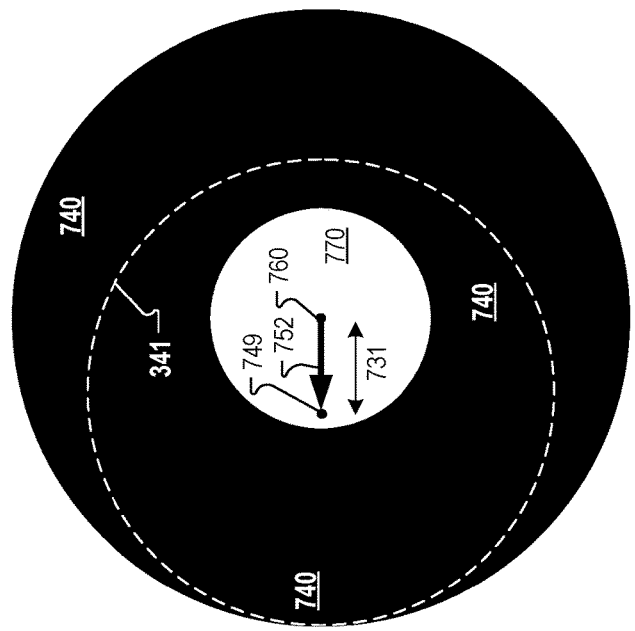

FIG. 7E illustrates central axis 742 of beam shaping profile 341 of a metasurface being offset from optical axis 760 of optical aperture 770 by an offset distance 731 that is greater than offset distance 730. The steering actuator adjusts an axial position of the metasurface with respect to the optical aperture 770 of the laser to change the beam shape of the dynamically shaped laser light 753. Dynamically shaped laser light 753 has a deflection angle resulting from the steering actuator adjusting a position of the metasurface by an offset distance 731. The deflection angle of dynamically shaped laser light 753 is even greater than dynamically shaped laser light 752, of FIG. 7D. The deflection angle may be 60 degrees or greater, in some implementations. The deflection angle may be 75 degrees or greater, in some implementations. FIG. 7F illustrates a top view of beam shaping profile 341 being adjusted by offset distance 731 and illustrates dynamically shaped laser light 753 having an even greater deflection angle to reach focal point 749. In particular, the central axis 742 of beam shaping profile 341 has been adjusted by offset distance 731 along an x-axis to move focal point 749 by offset distance 731. Thus, FIGS. 7A-7F illustrate that a steering actuator may adjust a position of a metasurface with respect to a laser to change a beam shape of dynamically shaped laser light. Of course, more granular adjustments are possible such that the deflection angle of the dynamically shaped laser light may be finely controlled. Additionally, those skilled in are appreciate that the steering actuator could also adjust the metasurface the opposite direction along the x-axis to direct dynamically shaped laser light in the opposite direction of dynamically shaped laser light 752 and 753.

Figure 7G:
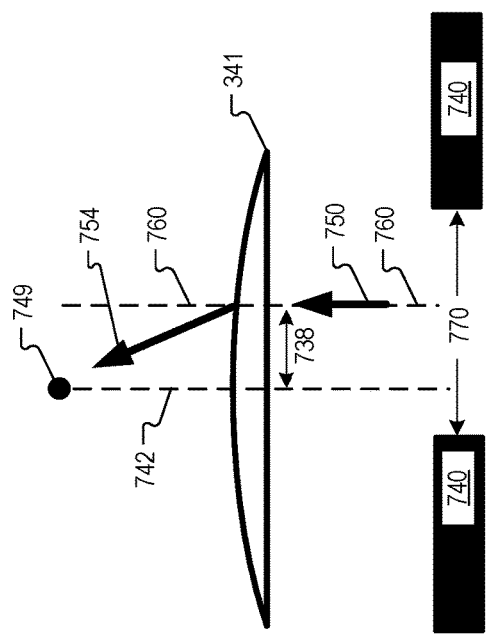
Figure 7H:
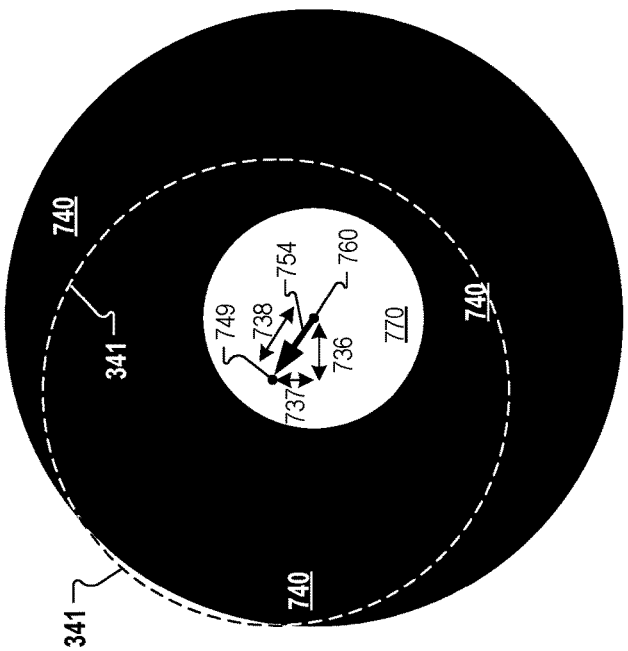

FIGS. 7G and 7H illustrate that a steering actuator can be adjusted in a first axis (e.g. x-axis) and a second axis (e.g. y-axis) to control the deflection angle of dynamically shaped laser light 754, in accordance with aspects of the disclosure. The steering actuator adjusts a position of the metasurface with respect to the optical aperture 770 of the laser to change the beam shape of the dynamically shaped laser light 754. Dynamically shaped laser light 754 has a deflection angle resulting from the steering actuator adjusting a position of the metasurface by an offset distance 738. FIG. 7H shows that offset distance 738 is the combination of the steering actuator adjusting the metasurface by an x offset 736 of the metasurface and a y offset 737 of the metasurface. Thus, dynamically shaped laser light is deflected to focal point 749 (along the central axis 749) of beam shaping profile 341. Here again, FIGS. 7G and 7H illustrate one example position of x-axis and y-axis offsets and the steering actuator may offset the beam shaping profile 341 to any x-axis and y-axis offset to steer the dynamically shaped laser light 754 according to any deflection angle commanded by the steering signal 199 that drives the steering actuator.

FIGS. 8A-8G illustrate multiple beam shaping profiles written into a single metasurface, in accordance with aspects of the disclosure. Example metasurface 810 includes beam shaping profiles 811, 812, 813, 814, 815, and 816. Beam shaping profiles 812, 813, 814, 815, and 816 may be considered meta-prism components. In the example metasurface 810, the plurality of meta-prism components progressively increase a deflection angle of the dynamically shaped laser light.

Figure 8A:
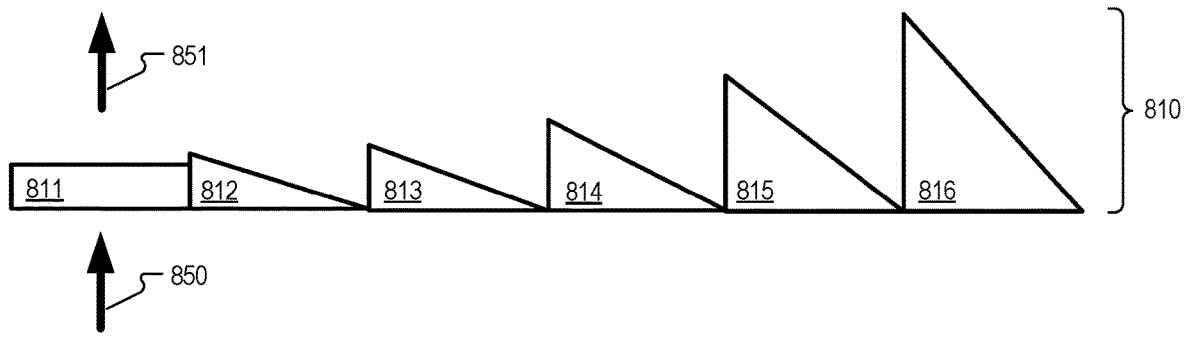
FIGS. 8A-8H illustrate multiple beam shaping profiles written into a single metasurface, in accordance with aspects of the disclosure.

In FIG. 8A, laser light 850 encounters beam shaping profile 811 and dynamically shaped laser light 851 may continue on the same optical path as laser light 850 as beam shaping profile 811 does not impart a deflection angle to incident laser light 850.

Figure 8B:
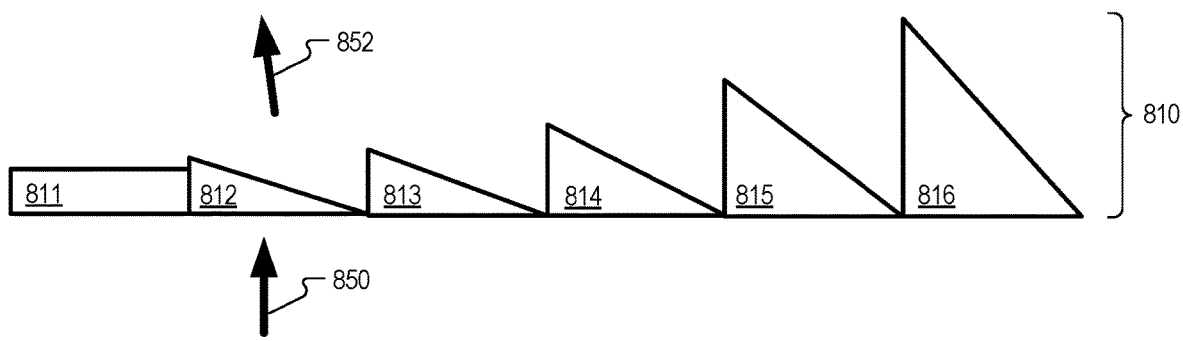

FIG. 8B illustrates a steering actuator has adjusted metasurface 810 with respect to a laser so that laser light 850 encounters beam shaping profile 812. Beam shaping profile 812 imparts a slight deflection angle to generate dynamically shaped laser light 852.

Figure 8C:
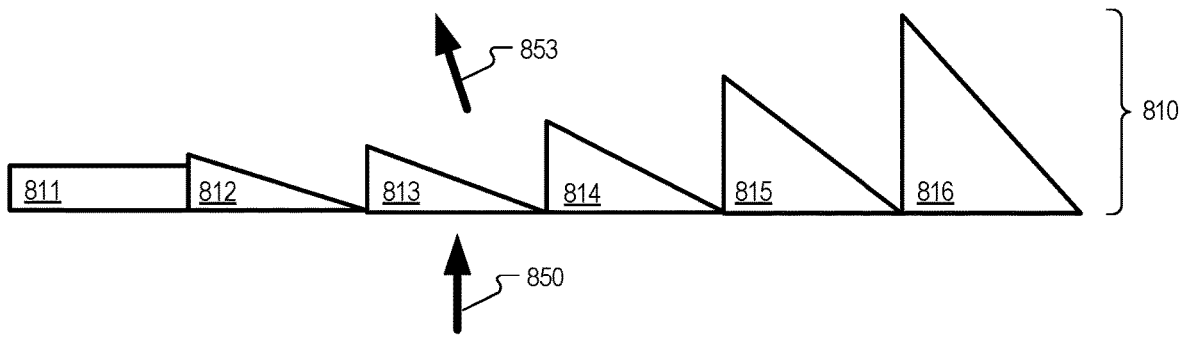

FIG. 8C illustrates a steering actuator has adjusted metasurface 810 with respect to a laser so that laser light 850 encounters beam shaping profile 813. Beam shaping profile 813 imparts a deflection angle to generate dynamically shaped laser light 853 that is greater than the deflection angle of dynamically shaped laser light 852.

Figure 8D:
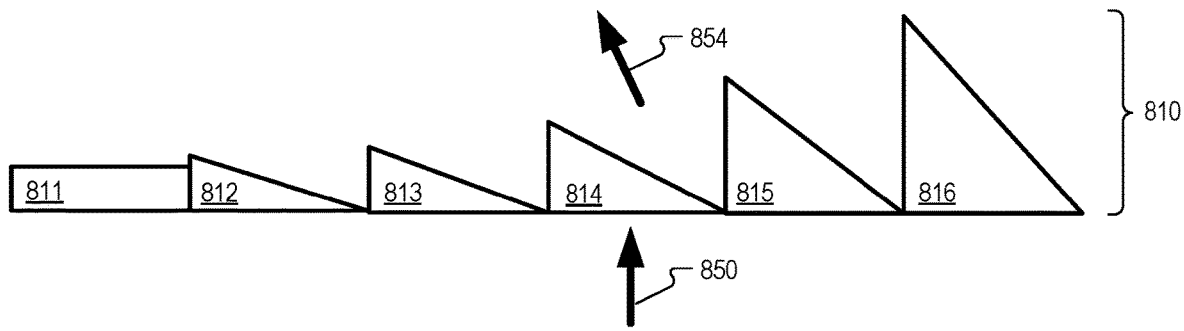

FIG. 8D illustrates a steering actuator has adjusted metasurface 810 with respect to a laser so that laser light 850 encounters beam shaping profile 814. Beam shaping profile 814 imparts a deflection angle to generate dynamically shaped laser light 854 that is greater than the deflection angle of dynamically shaped laser light 853.

Figure 8E:
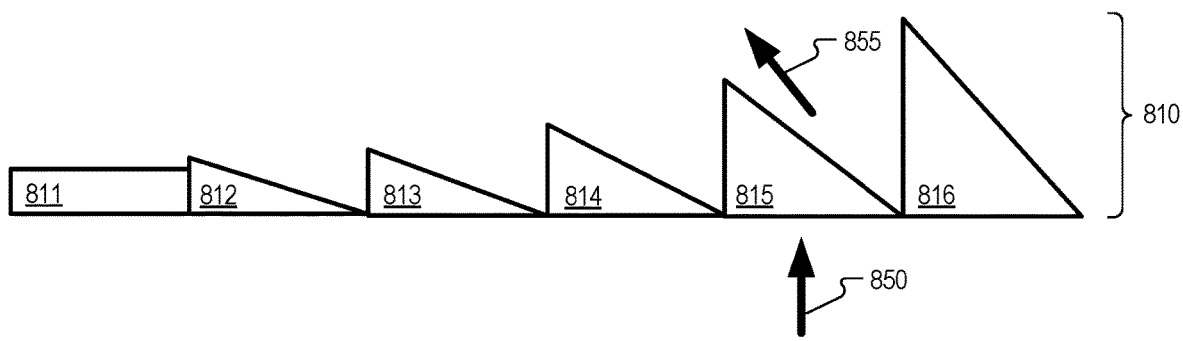

FIG. 8E illustrates a steering actuator has adjusted metasurface 810 with respect to a laser so that laser light 850 encounters beam shaping profile 815. Beam shaping profile 815 imparts a deflection angle to generate dynamically shaped laser light 855 that is greater than the deflection angle of dynamically shaped laser light 854.

Figure 8F:
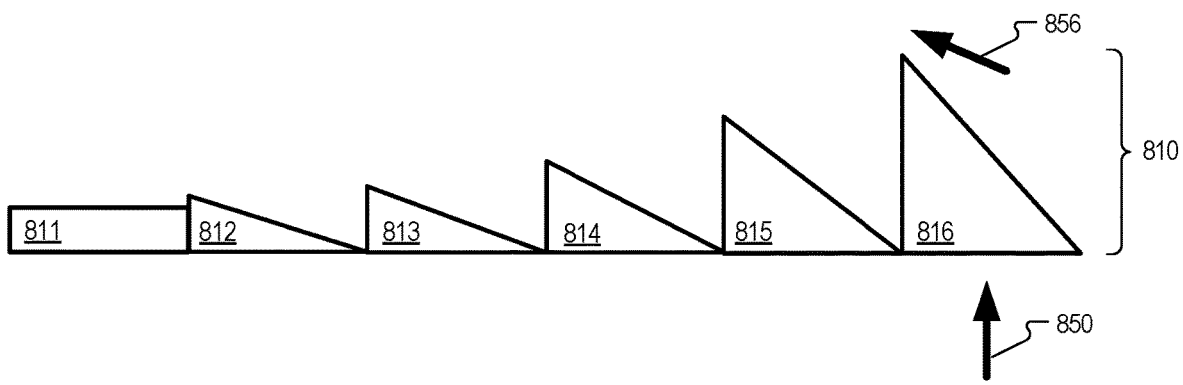

FIG. 8F illustrates a steering actuator has adjusted metasurface 810 with respect to a laser so that laser light 850 encounters beam shaping profile 816. Beam shaping profile 816 imparts a deflection angle to generate dynamically shaped laser light 856 that is greater than the deflection angle of dynamically shaped laser light 855.

Figure 8G:
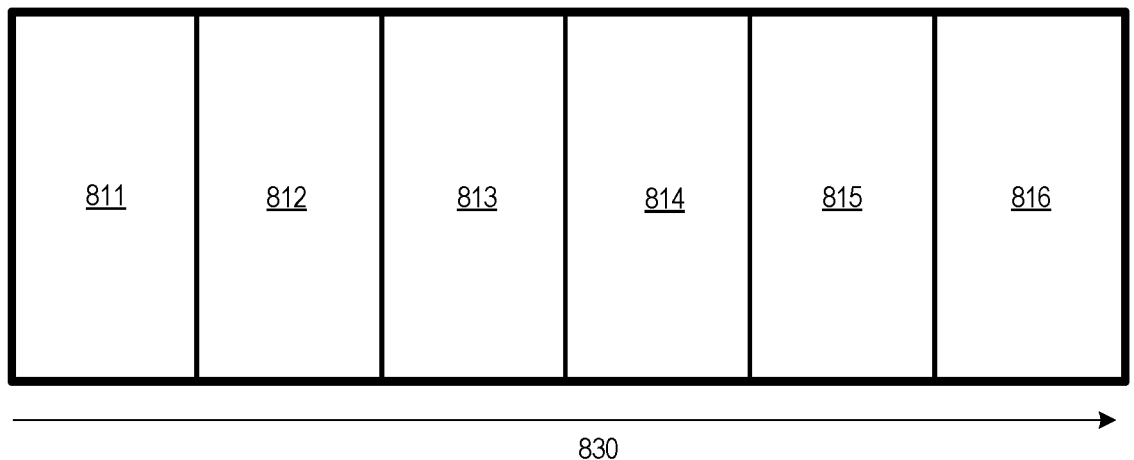

FIG. 8G illustrates that beam shaping profile components 811, 812, 813, 814, 815, and 816 may be arranged linearly on metasurface 810 so that an offset distance (driven by a steering actuator) along a first axis 830 allows for adjusting the deflection angle of the dynamically steered laser light.

Figure 8H:
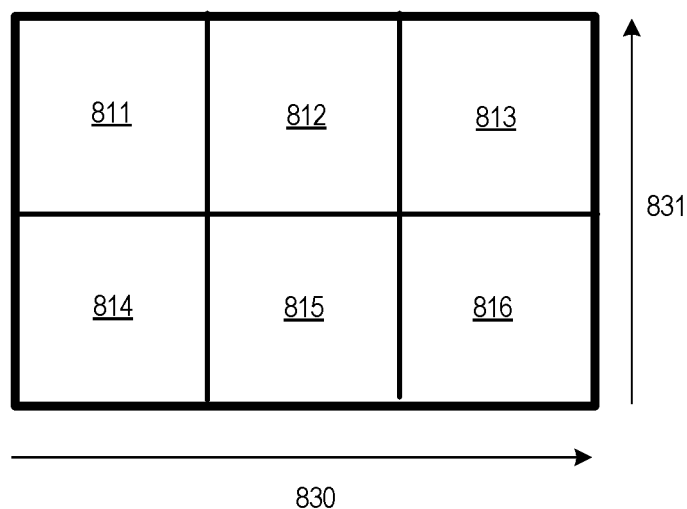

FIG. 8H illustrates that beam shaping profile components 811, 812, 813, 814, 815, and 816 may be arranged on metasurface 860 so that an offset distance (driven by a steering actuator) along a first axis 830 and along a second axis 831 allows for adjusting the deflection angle of the dynamically steered laser light. In other implementations (not illustrated), a beam may be moved along a first axis of a metasurface with multiple beam shaping profile components or the beam may be moved diagonally to illuminate a particular beam shaping profile component in the metasurface.

Figure 9A:
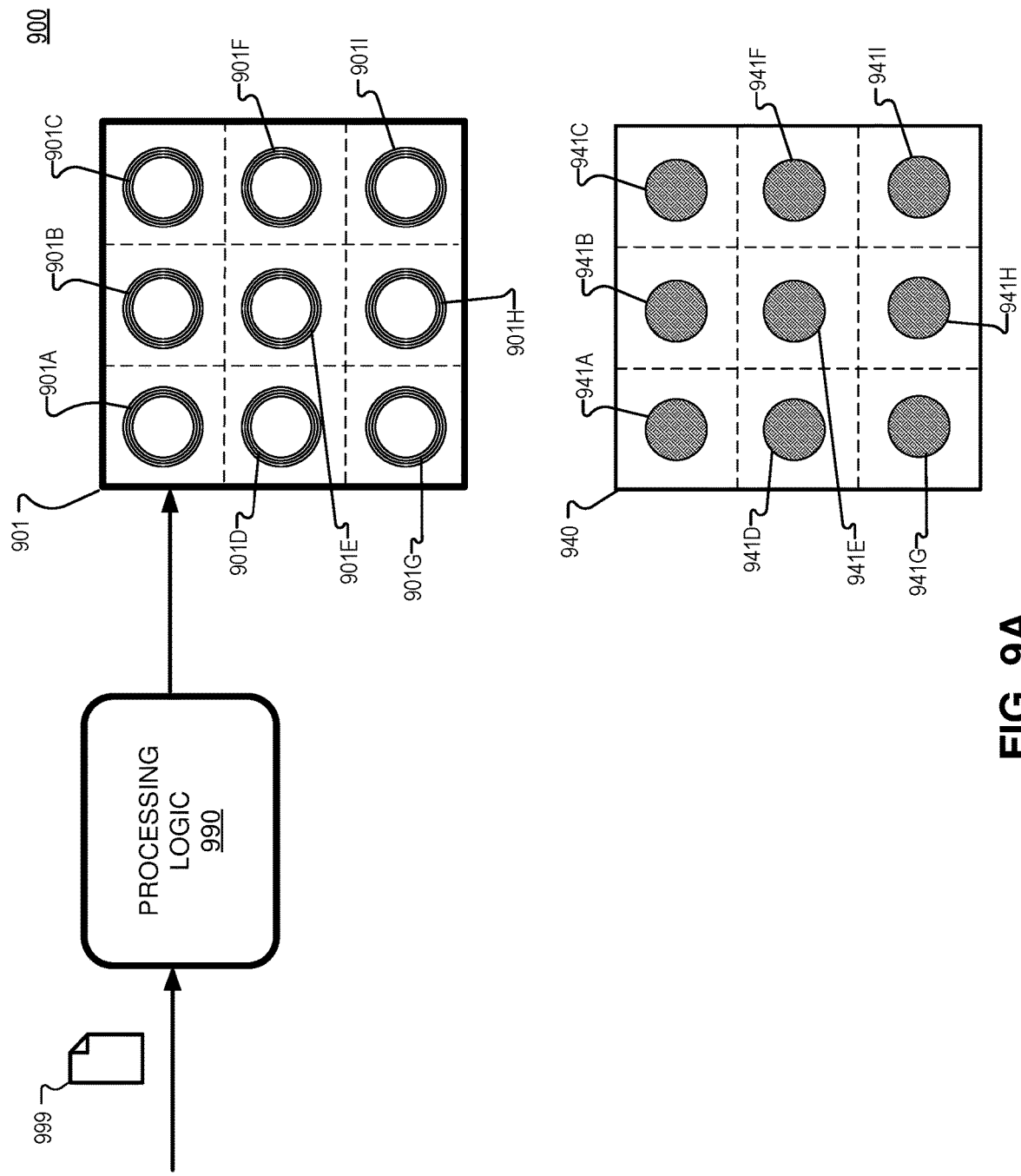
FIGS. 9A-9C illustrate a device including a plurality of lasers and a plurality of metasurfaces, in accordance with aspects of the disclosure.
Figure 9B:
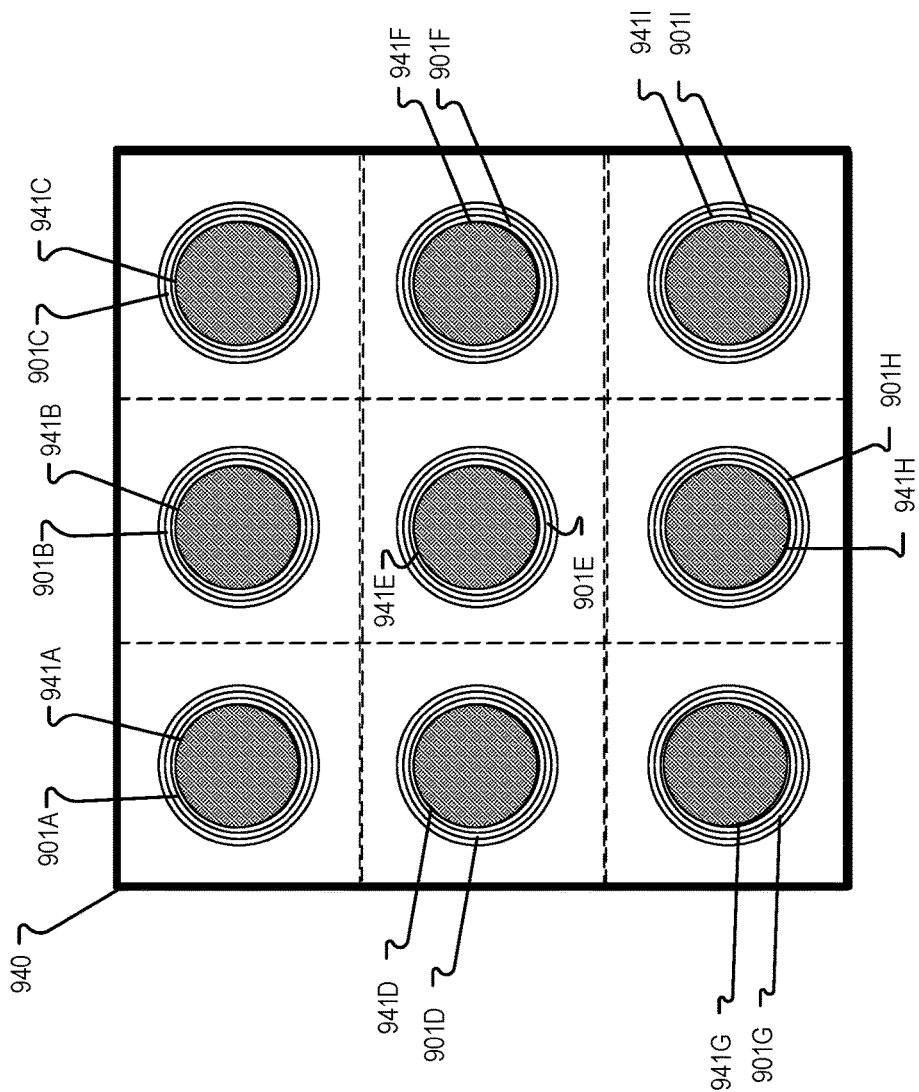

FIG. 9A illustrates a device 900 including processing logic 990, a plurality of lasers 901, and a plurality of metasurfaces 941 formed in refractive layer 940, in accordance with aspects of the disclosure. Refractive layer 940 may include any of the refractive semiconductor layers, refractive dielectric layers, and/or refractive insulator layers described above. FIG. 9B illustrates the plurality of metasurfaces 941A, 941B, 941C, 941D, 941E, 941F, 941G, 941H, and 941I (collectively referred to as metasurfaces 941) may be aligned over apertures of corresponding lasers 901A, 901B, 901C, 901D, 901E, 901F, 901G, 901H, and 901I (collectively referred to as lasers 901). Lasers 901 may be VCSELs. Lasers 901 may be near-infrared lasers.

Returning to FIG. 9A, processing logic 990 selectively activates lasers 901 in response to one or more steering signals 999. Processing logic 990 may activate (turn on) a particular laser 901 to emit laser light by driving a voltage onto a gate of a transistor that provides current to the particular laser 901, for example. In some implementations, processing logic 990 activates only one laser at a time. In some implementations, processing logic 990 may activate a plurality of lasers in a same time period. Each metasurface 941 may have a different beam shaping profile from the other metasurfaces 941 so that activating each laser 901 generates shaped laser light having a different illumination profile.

FIGS. 9A and 9B illustrate a three-by-three array of lasers 901 and corresponding metasurfaces 941. Of course, other arrangements with different numbers of lasers and corresponding metasurfaces may be used. For example, an array of three lasers, four lasers, six lasers, eight lasers, or sixteen lasers with a corresponding number of metasurfaces 941 is possible.

By way of example, a device may include a first laser configured to emit first laser light (e.g. 901A) through a first aperture of the first laser and a second laser (e.g. 901B) configured to emit second laser light through a second aperture of the second laser. The device may include processing logic configured to activate the first laser to emit the first laser light in response to a first steering signal. The processing logic may also be configured to activate the second laser to emit the second laser light in response to a second steering signal. A first metasurface (e.g. metasurface 941A) is disposed over the first aperture of the first laser. The first metasurface is configured to generate first shaped laser light in response to receiving the first laser light from the first laser. A second metasurface (e.g. metasurface 941B) disposed over the second aperture of the second laser. The second metasurface is configured to generate second shaped laser light in response to receiving the second laser light from the second laser. The second shaped laser light has a different illumination profile than the first shaped laser light.

The processing logic may be configured to deactivate the first laser in response to receiving the second steering signal and configured to deactivate the second laser in response to receiving the first steering signal so that second laser is off when the first laser is on, and vice-versa.

The device may further include a third laser (e.g. third laser 901C) configured to emit third laser light through a third aperture of the third laser and a fourth laser (e.g. laser 901D) configured to emit fourth laser light through a fourth aperture of the fourth laser. A third metasurface (e.g. metasurface 941C) may be disposed over the third aperture of the third laser. The third metasurface is configured to generate third shaped laser light in response to receiving the third laser light from the third laser. A fourth metasurface (e.g. metasurface 941D) may be disposed over the fourth aperture of the fourth laser. The fourth metasurface is configured to generate fourth shaped laser light in response to receiving the fourth laser light from the fourth laser. The third shaped laser light has a different illumination profile than the first shaped laser light, the second shaped laser light, and the fourth shaped laser light. The processing logic may be further configured to activate the third laser to emit the third laser light in response to a third steering signal and activate the fourth laser to emit the fourth laser light in response to a fourth steering signal.

Figure 9C:
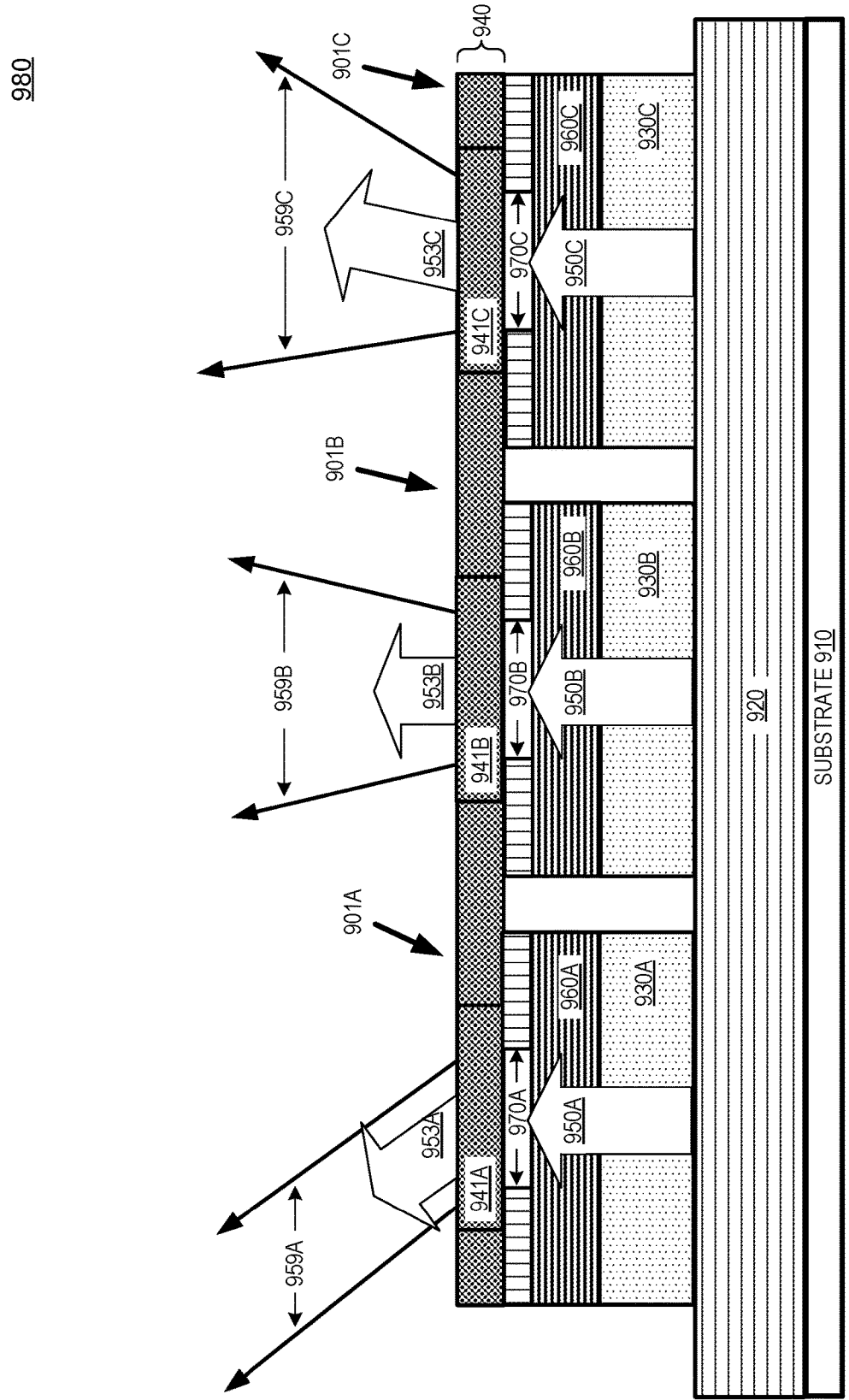

FIG. 9C illustrates a side view of an example device 980 that includes at least three lasers 901A, 901B, and 901C, in accordance with aspects of the disclosure. FIG. 9C illustrates that when first laser 901A is activated, metasurface 941A generates dynamically shaped laser light 953A in response to receiving laser light 950A. Laser light 950A exits active region 930A and propagates through reflector layer 960A and through optical aperture 970A. When second laser 901B is activated, metasurface 941B generates dynamically shaped laser light 953B in response to receiving laser light 950B. Laser light 950B exits active region 930B and propagates through reflector layer 960B and through optical aperture 970B. When third laser 901C is activated, metasurface 941C generates dynamically shaped laser light 953C in response to receiving laser light 950C. Laser light 950C exits active region 930C and propagates through reflector layer 960C and through optical aperture 970C. Processing logic 990 may selectively activate first laser 901A, second laser 901B, and third laser 901C in response to receiving one or more steering signals 999. Although dynamically shaped laser light 953A, 953B, and 953C are all illustrated as being emitted in FIG. 9C, only one of the dynamically shaped laser light 953 may be emitted at a particular time period.

FIG. 9C illustrates that different illumination profiles of dynamically shaped laser light 953 may be generated depending on the laser 901 that is activated. For example, activating laser 901A generates dynamically shaped laser light 953A that is deflected and has a relatively narrow illumination profile 959A. Illumination profile 959A may be collimated, in some implementations. Activating laser 901B generates dynamically shaped laser light 953B that has a diverging illumination profile 959B. Activating laser 901C generates dynamically shaped laser light 953C that has a diverging and deflected illumination profile 959C. Thus, pairing different metasurfaces 941 with different lasers 901 allows for selectively generating virtually any illumination profile 959 that can be written into a metasurface.

FIG. 9C illustrates that, in some implementations, a plurality of lasers may be fabricated on a shared substrate 910. The plurality of lasers may share the same first reflector layer 920. Furthermore, active regions 930 and second reflector layer 960 may be fabricated in a same semiconductor fabrication process. Metasurfaces 941A, 941B, and 941C may be formed in a same refractive layer 940. Refractive layer 940 may include the refractive semiconductor layers, refractive dielectric layers, or other refractive insulator layers described in this disclosure. Refractive layer 940 may be integrated with lasers 901A, 901B, and 901C when refractive layer 940 is formed over apertures 970 of the lasers 901 in a same fabrication process that forms lasers 901. Metasurfaces 941 may be formed in a subtractive etching process that includes photolithography techniques.

Figure 10A:
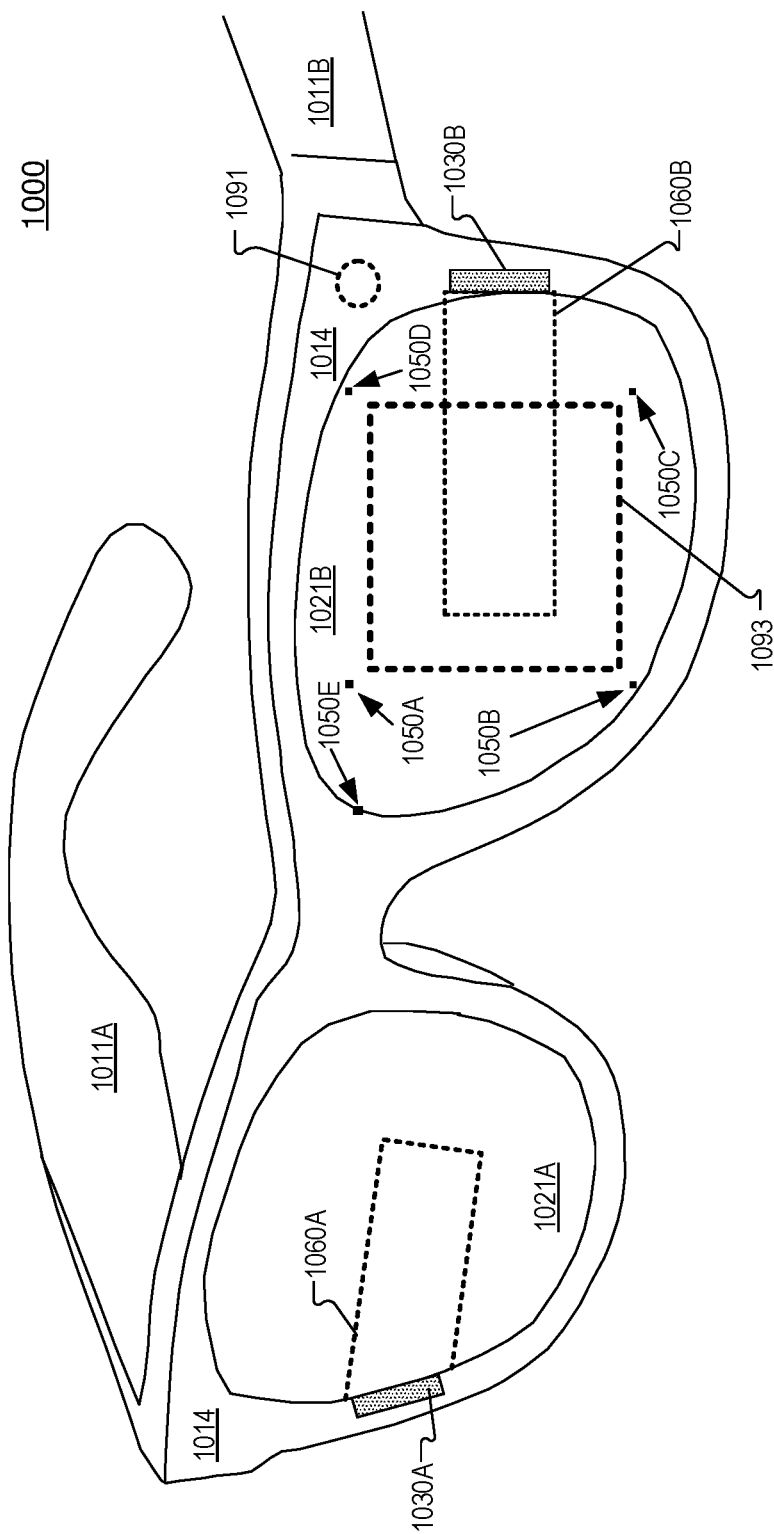
FIGS. 10A-10B illustrate an example head mounted device and near-eye optical element that includes beam steering devices for dynamically beam steering infrared light in an eyebox direction, in accordance with aspects of the disclosure.

FIG. 10A illustrates an example head mounted device 1000 that includes an array of beam steering devices 1050 for dynamically beam steering infrared light in an eyebox direction, in accordance with an embodiment of the disclosure. Head mounted device 1000 includes frame 1014 coupled to arms 1011A and 1011B. Lenses 1021A and 1021B are mounted to frame 1014. Lenses 1021 may be prescription lenses matched to a particular wearer of head mounted device or non-prescription lenses. The illustrated head mounted device 1000 is configured to be worn on or about a head of a user of the head mounted device.

In FIG. 10A, head mounted device 1000 is a head mounted display (HMD) where each lens 1021 includes a waveguide 1060 to direct image light generated by a display 1030 to an eyebox area for viewing by a wearer of head mounted device 1000. Display 1030 may include an LCD, an organic light emitting diode (OLED) display, micro-LED display, quantum dot display, pico-projector, or liquid crystal on silicon (LCOS) display for directing image light to a wearer of head mounted device 1000. Some head mounted devices may not necessarily be HMDs but still include infrared light sources to illuminate an eyebox region for eye-tracking purposes, for example.

The frame 1014 and arms 1011 of the head mounted device may include supporting hardware of head mounted device 1000. Head mounted device 1000 may include any of processing logic, wired and/or wireless data interface for sending and receiving data, graphic processors, and one or more memories for storing data and computer-executable instructions. In one embodiment, head mounted device 1000 may be configured to receive wired power. In one embodiment, head mounted device 1000 is configured to be powered by one or more batteries. In one embodiment, head mounted device 1000 may be configured to receive wired data including video data via a wired communication channel. In one embodiment, head mounted device 1000 is configured to receive wireless data including video data via a wireless communication channel.

Lenses 1021 may appear transparent to a user to facilitate augmented reality or mixed reality where a user can view scene light from the environment around her while also receiving image light directed to her eye(s) by waveguide(s) 1060. Lenses 1021 may include an optical combiner 1093 for directing reflected infrared light (emitted by beam steering device(s) 1050) to an eye-tracking camera (e.g. camera 1091). Those skilled in the art understand that the array of beam steering devices 1050 on a transparent substrate could also be included advantageously in a VR headset where the transparent nature of the optical structure allows a user to view a display in the VR headset. In some embodiments of FIG. 10A, image light is only directed into one eye of the wearer of head mounted device 1000. In an embodiment, both displays 1030A and 1030B are included to direct image light into waveguides 1060A and 1060B, respectively. The term VCSEL is used throughout this disclosure as an example of a light source in general, although those skilled in the art appreciate that in some embodiments, other lasers may be used instead of the specifically described VCSELs.

Lens 1021B includes an array of beam steering devices 1050. Devices 1050 may include near-infrared light sources directing their emitted near-infrared light in an eyeward direction to an eyebox area of a wearer of head mounted device 1000. Devices 1050 may include the beam steering devices of this disclosure (e.g. devices 100, 900, or 980) that are capable of dynamically beam steering light with metasurfaces. VCSELs included in beam steering devices 1050 may emit near-infrared light having a wavelength of 850 nm or 940 nm, for example. Very small metal traces or transparent conductive layers (e.g. indium tin oxide) may run through lens 1021B to facilitate selective illumination of each device 1050. Lens 1021A may be configured similarly to the illustrated lens 1021B.

While beam steering devices 1050 may introduce occlusions into an optical system included in a head mounted device 1000, devices 1050 and corresponding routing may be so small as to be unnoticeable or optically insignificant to a wearer of a head mounted device. Additionally, any occlusion from devices 1050 will be placed so close to the eye as to be unfocusable by the human eye and therefore assist in the devices 1050 being not noticeable. In addition to a wearer of head mounted device 1000 potentially noticing devices 1050, it may be preferable for an outside observer of head mounted device 1000 to not notice beam steering devices 1050. Since beam steering devices 1050 have beam steering capability, fewer beam steering devices 1050 may be needed to be used to efficiently illuminate the eyebox area when compared to static light sources. For example, FIG. 10A shows only four beam steering devices 1050A, 1050B, 1050C, and 1050D are used to illuminate the eyebox region where an array of twenty or more VCSELS may have previously been used to illuminate the eyebox region. Furthermore, the beam steering capability of devices 1050 may allow for the beam steering devices 1050 to be disposed out of a field of view (FOV) of the user. For example, beam steering device 1050E is disposed in the frame 1014 of head mounted device 1000. In some implementations, beam steering devices that include the source(s)

and the metasurfaces may be placed on a frame 1014 or temple area of head mounted device 1000 to illuminate an additional optic included in a lens 1021. In this implementation, the additional optic is configured to redirect the beam received from the beam steering device to illuminate the eyebox. The additional optic may be a holographic optical element (HOE) configured to reflect near-infrared wavelengths matching the linewidth of the received beam or the additional optic may include a dichroic reflector (sometimes referred to as a "hot mirror") to reflect near-infrared wavelengths matching the linewidth of the received beam.

Figure 10B:
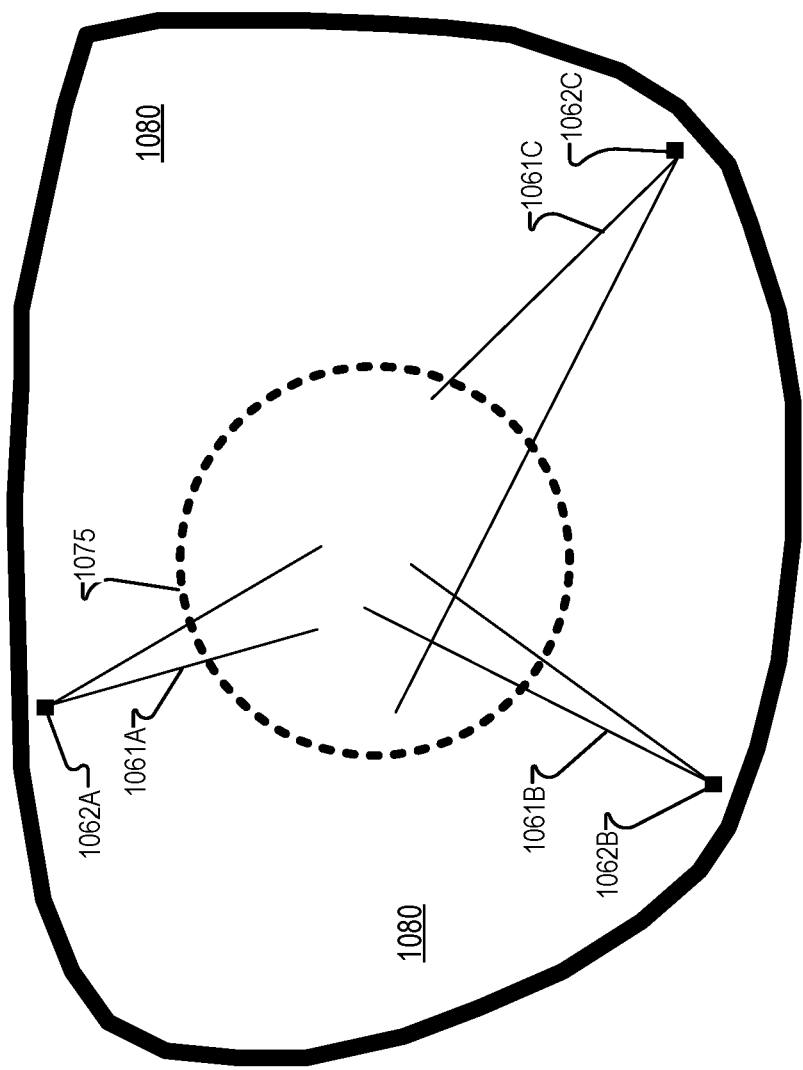

FIG. 10B illustrates an example near-eye optical element 1072 that includes a plurality of beam steering devices 1062 that include a laser (e.g. a VCSEL) and a beam shaping metasurface. Beam steering devices 1062 may be coupled with transparent optical layer 1080. An eyeward side of the transparent optical layer 1080 is disposed opposite of a scene side of the transparent optical layer 1080. Near-eye optical element 1072 may be included into head mounted device 1000, for example. For purposes of illuminating an eyebox region 1075, it may be advantageous to dynamically steer the laser light 1061 to illuminate the eyebox region 1075. To illuminate eyebox region 1075, the beam steering devices 1062 may benefit from dynamically changing the beam shape of the laser light 1061. Beam steering devices 1062 may be driven to illuminate particular portions of eyebox region 1075 in response to eye-tracking images captured by a camera (e.g. camera 991) of the head mounted device 1000.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The term "processing logic" (e.g. processing logic 990) in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data. Processing logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

Communication channels may include or be routed through one or more wired or wireless communication utilizing IEEE 802.11 protocols, BlueTooth, SPI (Serial Peripheral Interface), I$^2$C (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. "the Internet"), a private network, a satellite network, or otherwise.

A computing device may include a desktop computer, a laptop computer, a tablet, a phablet, a smartphone, a feature phone, a server computer, or otherwise. A server computer may be located remotely in a data center or be stored locally.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A near-eye optical element, comprising:
    a transparent optical layer, wherein the transparent optical layer includes an eyeward side disposed opposite of a scene side of the transparent optical layer; and
    a near-infrared light source coupled with the transparent optical layer, the near-infrared light source including:
        a near-infrared vertical-cavity surface-emitting laser (VCSEL) configured to emit near-infrared laser light through an aperture;
        a metasurface disposed on a plane adjacent to and over the aperture, and configured to generate dynamically shaped near-infrared laser light in response to receiving the near-infrared laser light through the aperture from the near-infrared VCSEL; and
        a steering actuator configured to receive a steering signal, wherein the steering actuator is configured to adjust a position of the metasurface along the plane with respect to the near-infrared VCSEL to change a beam shape of the dynamically shaped near-infrared laser light for illuminating an eyebox area.

2. The near-eye optical element of claim 1, wherein the steering actuator is configured to change an axial position of the metasurface with respect to an optical axis of the near-infrared VCSEL.

3. The near-eye optical element of claim 1, wherein the steering actuator includes at least one of a piezo actuator, a micro-electro-mechanical system (MEMS), or an electrostatic actuator.

4. A device, comprising:
a laser configured to emit laser light;
a metasurface configured to generate dynamically shaped laser light in response to receiving the laser light from the laser; and
a steering actuator configured to receive a steering signal, wherein the steering actuator is configured to adjust a position of the metasurface with respect to the laser to change a beam shape of the dynamically shaped laser light, and wherein the steering actuator is physically coupled to the laser and formed in a same semiconductor fabrication process that forms the laser.

5. The device of claim 4, wherein the steering actuator is configured to change an axial position of the metasurface with respect to an optical axis of the laser.

6. The device of claim 5, wherein the steering actuator is configured to adjust an x offset of the metasurface and a y offset of the metasurface with respect to the optical axis of the laser.

7. The device of claim 4, wherein the steering actuator is physically coupled to the laser by a layer that defines an aperture through which the laser light passes so as to be received by the metasurface.

8. The device of claim 4, wherein the laser is a near-infrared laser emitting near-infrared laser light.

9. The device of claim 4, wherein the metasurface includes nanostructures formed of a refractive semiconductor layer.

10. The device of claim 4, wherein the metasurface has a thickness of less than 500 nm.

11. The device of claim 4, wherein a deflection angle of the dynamically shaped laser light is 60 degrees or greater.

12. The device of claim 11, wherein the deflection angle of the dynamically shaped laser light is 75 degrees or greater.

13. The device of claim 4, wherein the metasurface includes a plurality of meta-prism components that progressively increase a deflection angle of the dynamically shaped laser light.

14. The device of claim 4, wherein the steering actuator includes at least one of a piezo actuator, a micro-electromechanical system (MEMS), or an electrostatic actuator.

15. The device of claim 4, wherein the steering actuator is configured to adjust the position of the metasurface along a first plane that is parallel to a second plane of an optical aperture of the laser.

16. A device, comprising:
a first laser configured to emit first laser light through a first aperture of the first laser;
a second laser configured to emit second laser light through a second aperture of the second laser;
processing logic configured to activate the first laser to emit the first laser light in response to a first steering signal, wherein the processing logic is configured to activate the second laser to emit the second laser light in response to a second steering signal;
a first metasurface formed in a layer located on a plane and disposed over the first aperture of the first laser, wherein the first metasurface is configured to generate first shaped laser light in response to receiving the first laser light from the first laser;
a second metasurface formed in the layer located on the plane and disposed over the second aperture of the second laser, wherein the second metasurface is configured to generate second shaped laser light in response to receiving the second laser light from the second laser, wherein the second shaped laser light has a different illumination profile than the first shaped laser light;
a third laser configured to emit third laser light through a third aperture of the third laser;
a fourth laser configured to emit fourth laser light through a fourth aperture of the fourth laser;
a third metasurface disposed over the third aperture of the third laser, wherein the third metasurface is configured to generate third shaped laser light in response to receiving the third laser light from the third laser; and
a fourth metasurface disposed over the fourth aperture of the fourth laser, wherein the fourth metasurface is configured to generate fourth shaped laser light in response to receiving the fourth laser light from the fourth laser, wherein the third shaped laser light has a different illumination profile than the first shaped laser light, the second shaped laser light, and the fourth shaped laser light,
wherein the processing logic is configured to activate the third laser to emit the third laser light in response to a third steering signal, and further wherein the processing logic is configured to activate the fourth laser to emit the fourth laser light in response to a fourth steering signal.

17. The device of claim 16, wherein the layer is a refractive semiconductor layer.

18. The device of claim 17, wherein the refractive semiconductor layer is integrated with the first laser and the second laser.

19. The device of claim 16, wherein the first laser is a first near-infrared vertical-cavity surface-emitting laser (VCSEL), and wherein the second laser is a second near-infrared VCSEL, and further wherein the processing logic is configured to deactivate the first laser in response to receiving the second steering signal and configured to deactivate the second laser in response to receiving the first steering signal.

* * * * *